US007223513B2

(12) United States Patent
Nakane et al.

(10) Patent No.: US 7,223,513 B2
(45) Date of Patent: May 29, 2007

(54) THERMAL TRANSFER IMAGE RECEIVING SHEET AND MANUFACTURING METHOD OF THERMAL TRANSFER IMAGE RECEIVING SHEET

(75) Inventors: Hiroki Nakane, Hino (JP); Kenji Michiue, Hachioji (JP); Tadanobu Sekiya, Hachioji (JP)

(73) Assignee: Konica Minolta Photo Imaging, Inc. (JP)

( * ) Notice: Subject to any disclaimer, the term of this patent is extended or adjusted under 35 U.S.C. 154(b) by 101 days.

(21) Appl. No.: 11/203,539

(22) Filed: Aug. 12, 2005

(65) Prior Publication Data

US 2006/0046931 A1 Mar. 2, 2006

(30) Foreign Application Priority Data

Aug. 25, 2004 (JP) ............................. 2004-244782

(51) Int. Cl.
*G03F 7/34* (2006.01)
*G03C 8/52* (2006.01)
*B41M 5/20* (2006.01)

(52) U.S. Cl. ...................... 430/200; 430/201; 428/32.5

(58) Field of Classification Search ................ 430/200, 430/201; 428/32.5
See application file for complete search history.

(56) References Cited

U.S. PATENT DOCUMENTS 6,638,893 B2 * 10/2003 Laney et al. ................ 503/227

FOREIGN PATENT DOCUMENTS

| | | | |
|---|---|---|---|
| EP | 545893 | * | 6/1993 |
| JP | 6-171240 | * | 6/1994 |
| JP | 2004-9572 | * | 1/2004 |

* cited by examiner

*Primary Examiner*—Richard L. Schilling
(74) *Attorney, Agent, or Firm*—Squire, Sanders & Dempsey L.L.P.

(57) ABSTRACT

A thermal transfer image receiving sheet comprising a heat insulating layer and a layer adjacent to the heat insulating layer on a substrate, wherein the heat insulating layer is provided between the layer and the substrate, the heat insulating layer contains hollow particles in an amount of at least 65 percent by mass, and the heat insulating layer and the layer are formed by simultaneous multi-layer coating.

12 Claims, No Drawings

THERMAL TRANSFER IMAGE RECEIVING SHEET AND MANUFACTURING METHOD OF THERMAL TRANSFER IMAGE RECEIVING SHEET

FIELD OF THE INVENTION

The present invention relates to a thermal transfer image receiving sheet, containing a heat insulating layer including hollow particles, used together with the thermal transfer ink sheet arranged on the top of the thermal transfer image receiving sheet.

BACKGROUND OF THE INVENTION

What is commonly known in the prior art for forming a color image or black-and-white image includes a technique (so-called a pigment thermal transfer method) wherein the ink sheet containing the thermally diffusive pigment subjected to diffusion and migration by heating is arranged face to face with an image receiving layer of the image receiving sheet, and the thermally diffusive pigment is thermally transferred onto this image receiving layer as an image, using a thermal printing means such as a thermal head or laser, whereby an image is formed. Such a thermal transfer method is highly evaluated as a technique of producing a high-quality image comparable to the image obtained from silver halide photography, using digital data, without the need of utilizing any processing solution such as a developing solution.

To provide a superb printing characteristic in the recording method based on thermal transfer technique using a pigment, it is important to incorporate a heat insulating function and cushioning function into the thermal transfer image receiving sheet. This importance has been recognized in the prior art.

One of the known methods for meeting this requirement is to bond an expanded film having both the heat insulating function and cushioning function onto a substrate, and to arrange an image receiving layer thereon. This method causes the expanded film to be shrunken by the heat produced by coating of the image receiving layer, with the result that a curl will be found in the final product. Such a problem has been observed in the prior art. To overcome these difficulties, a study has been made to develop a new functional layer having the heat insulating function and cushioning function. A study has also been made to provide a thermal transfer image receiving sheet and its manufacturing method without using the step of bonding a expanded film or the like, in order to eliminate the possibility of a curl being produced by heat history in the manufacturing process. Such a method is exemplified by a coating method.

For example, a thermal transfer image receiving sheet having an intermediate layer and image receiving layer provided on a substrate has been disclosed. This sheet is characterized in that the intermediate layer is composed of a layer mainly comprising:

hollow particles having a diameter of 0.1 through 100 μm obtained by thermal expansion of thermally expanding plastic substances; or hollow polymer particles, shaped like a micro-capsule, having a diameter of 0.1 through 20 μm; and high polymers impervious to organic solvent (Patent Document 1).

To get a heat insulating effect when using the hollow particles, it is generally necessary to ensure a high fill factor sufficient to allow use of the void between particles. It is not possible to avoid irregularities in surface smoothness or reduction in the strength of the layer resulting from a low percentage of binder. Not only that, when a further layer is coated thereon, air bubbles present in the voids between hollow particles tend to rise and to give an adverse effect to the image receiving layer in the final stage, with the result that uneven printing will occur.

A solution to these problems is disclosed in an image receiving sheet formed by sequential lamination of a heat insulating layer and an image receiving layer containing hollow particles on the substrate of cellulose paper, for example. In this sheet, the substrate has an air permeability is 1,000 sec. or more without exceeding 3,500 sec. (Patent Document 2). However, this proposal is based on the concept of ensuring that air bubbles present in the void between hollow particles are released toward the substrate, wherein presence of these air bubbles raises a problem when a layer is coated on the layer containing hollow particles. This proposal makes it difficult for air bubbles to rise, but tends to encourage permeation of the liquid coated on the layer to be arranged on the layer containing hollow particles. This method allows film thickness to become uneven. Not only that, this approach causes the compositions of the coated liquid to fill the void between hollow particles close to the surface of the heat insulating layer where the heat insulating function is most effective. Thus, the originally intended heat insulating effect cannot be utilized. This method has such a problem.

Against this backdrop, there has been a long felt need for a thermal transfer image receiving sheet or manufacturing method thereof, capable of making the maximum use of the advantages of the heat insulating layer of the hollow particles, providing high-density printing characteristics, and ensuring uniform printing.

Further, a method for manufacturing a thermal transfer image receiving sheet is disclosed, wherein the water-based intermediate layer containing hollow particles, and the water-based image receiving layer containing a mold releasing agent adjacent thereto are coated according to the wet-on-wet method (Patent Document 3). This Patent Document 3 discloses a process of improving the viscosity of each coating solution and controlling the excessive mixture of liquids. When exposed to a high temperature in the step of drying, not a small amount of substances transfer takes place on the two adjacent liquid interfaces of high fluidity. For example, if the mold releasing layer in the wet image receiving layer transfers in the wet heat insulating layer, insufficient bondage occurs between the hollow particles close to the surface of the heat insulating layer. Smoothness of the interface will be reduced, with the result that uneven printing will occur.

[Patent Document 1] the Official Gazette of Japanese Patent Tokkaihei 11-321128

[Patent Document 2] the Official Gazette of Japanese Patent Tokkai 2004-9572

[Patent Document 3] the Official Gazette of Japanese Patent Tokkaihei 6-171240

SUMMARY OF THE INVENTION

In view of the prior art described above, it is an object of the present invention to provide a thermal transfer image receiving sheet or manufacturing method thereof, capable of making the maximum use of the advantages of the heat insulating layer of the hollow particles, providing high-density printing characteristics, and ensuring uniform printing.

The object of the present invention can be achieved by the following structures:

According to the first aspect of the present invention, a thermal transfer image receiving sheet comprises a heat insulating layer and a layer adjacent to the heat insulating layer on a substrate, wherein the heat insulating layer is provided between the layer and the substrate, the heat insulating layer contains hollow particles in an amount of at least 65 percent by mass, and the heat insulating layer and the layer are formed by simultaneous multi-layer coating.

It is preferable that the layer is an image receiving layer.

It is preferable that the layer is an intermediate layer, and an image receiving layer is provided on the intermediate layer.

It is preferable that the image receiving layer contains a metal ion-containing compound capable of forming a chelate compound through reaction with a dye capable of forming a chelate.

It is preferable that at least 3 percent by mass of the particles are cross-linked hollow particles.

According to the second aspect of the present invention, a method for manufacturing aforementioned thermal transfer image receiving sheet comprises forming the heat insulating layer and the layer adjacent to the heat insulating layer by simultaneous multi-layer coating.

It is preferable that the layer is an image receiving layer.

It is preferable that the layer is an intermediate layer, and an image receiving layer is provided on the intermediate layer.

It is preferable that the image receiving layer contains a metal ion-containing compound capable of forming a chelate compound through reaction with a dye capable of forming a chelate.

It is preferable that at least 3 percent by mass of the particles are cross-linked hollow particles.

The present invention provides a thermal transfer image receiving sheet or manufacturing method thereof, capable of making the maximum use of the advantages of the heat insulating layer of the hollow particles, providing high-density printing characteristics, and ensuring uniform printing.

DETAILED DESCRIPTION OF PREFERRED EMBODIMENTS

The following describes the details of the preferred forms of embodiment of the present invention:

The present inventors have made efforts to solve the aforementioned problems, and have found out that these problems can be solved by a thermal transfer image receiving sheet comprising a heat insulating layer and a layer adjacent to the heat insulating layer on a substrate, wherein the heat insulating layer is provided between the layer and the substrate, the heat insulating layer contains hollow particles in an amount of at least 65 percent by mass, and the heat insulating layer and the layer are formed by simultaneous multi-layer coating.

To solve the aforementioned problems with the coated film quality that have been caused in the prior art when each layer is formed by separate coating, the present invention uses that a high fill factor is utilized, wherein the hollow particle content in the heat insulating layer is 65% or more by mass, and the method of simultaneous coating of two or more layers—at least the heat insulating layer and a layer adjacent to the heat insulating layer—, and controls the irregularities in surface smoothness preferably by quickly cooling the wet film for gellation subsequent to coating. Thus, the present invention provides a thermal transfer image receiving sheet capable of making the maximum use of the advantages of the heat insulating layer of the hollow particles, providing high-density printing characteristics, and ensuring uniform printing, namely, immunity from white patches on a printed sheet.

The present inventors have also found out that the aforementioned advantages of the present invention can be more improved by adding the following arrangements: (1) the layer is an image receiving layer, (2) the layer is an intermediate layer, and an image receiving layer is provided on the intermediate layer, (3) the image receiving layer contains a metal ion-containing compound capable of forming a chelate compound through reaction with a dye capable of forming a chelate, (4) at least 3 percent by mass of the particles are cross-linked hollow particles.

The following describes the details of the present invention:

<<Thermal Transfer Image Receiving Sheet>>

In the first place, the details of the thermal transfer image receiving sheet according to the present invention will be described.

The thermal transfer image receiving sheet of the present invention has at least a heat insulating layer and image receiving layer on the substrate.

[Substrate]

The substrate used in the thermal transfer image receiving sheet of the present invention holds the image receiving layer and is subjected to heating during thermal transfer. Accordingly, the substrate is preferred to have mechanical strength for eliminating any handling problems, even when exposed to excessive heat.

For example, the aforementioned substrate can be made of:

cellulose fabric paper such as condenser paper, glassine paper, parchment paper or paper of high size, synthetic paper (polyolefin and polystyrene based paper), bond paper, art paper, coated paper, cast coated paper, wallpaper, backing paper, synthetic resin or emulsion impregnated paper, synthetic rubber latex impregnated paper, synthetic resin inner paper and paperboard; and a film of polyester, polyacrylate, polycarbonate, polyurethane, polyimide, polyether imide, cellulose derivative, polyethylene, ethylene-vinyl acetate copolymer, polypropylene, polystyrene, acryl, polyvinyl chloride, polyvinylidene chloride, polyvinyl alcohol, polyvinyl butyral, nylon, polyether ether ketone, polysulfone, polyether sulfone, tetrafluoro ethylene, perfluoro alkyl vinyl ether, polyvinyl fluoride, tetrafluoro ethylene ethylene, tetrafluoro ethylene hexafluoro propylene, polychloro trifluoro ethylene, polyvinylidene fluoride and others. Further, a white opaque film formed by adding a white pigment and filler to the aforementioned synthetic resin can also be used as a material.

Further, the laminate formed by a desired combination of the aforementioned materials can also be used. An example of typical laminates includes paper made of synthesis of cellulose fabric paper and synthetic paper or cellulose synthetic paper and plastic film. The thickness of the substrate is normally in the range from 10 through 300 μm, without any restriction.

To provide higher printing quality and high image quality free from uneven density or a white patch on a printed sheet, the substrate preferably contains a layer having minute voids. As the layer having minute voids, a plastic film or synthetic paper containing minute voids can be used. When the plastic film or synthetic paper containing minute voids is used, polyolefin, especially polypropylene, as a major component is blended with an inorganic pigment and/or a polymer incompatible with polypropylene. This is used as a void forming initiator, and the mixture is oriented and formed into a film. The plastic film forming in this manner or the synthetic paper made thereof is preferably used. As compared to the case which the polyester is used as a major component, the mixture with polypropylene as a major component provides excellent cushioning and heat insulating properties due to superb viscoelastic or thermal properties, and also exhibits excellent printing sensitivity, so that uneven density hardly occurs.

When the aforementioned points are taken into account, the modulus of elasticity of the plastic film and synthetic paper at 20 degrees Celsius is preferably $5\times10^8$ Pa through $1\times10^{10}$ Pa. Such a plastic film and synthetic paper are normally formed by biaxial orientation. Accordingly, they will shrink upon heating. When they are left to stand at 110 degrees Celsius for 60 seconds, they are preferred to have shrinkage of 0.5 through 2.5%.

To prevent curling, whenever required, the side of the substrate opposite to the side where the image receiving layer is provided can be provided with a layer composed of a resin such as polyvinyl alcohol, polyvinylidene chloride, polyethylene, polypropylene, denatured polyolefin, polyethylene terephthalate and polycarbonate; and synthetic paper. Such a layer can be bonded by a commonly known lamination method such as a dry lamination, non-solvent (hot melt) lamination or EC lamination method. The dry lamination or non-solvent lamination method is preferably utilized. The adhesive suitable for use in non-solvent lamination method includes Takenate 720L by Takeda Chemical Industries, Ltd. The adhesive suitable for use in dry lamination method includes Takelac A969 and Takenate A-5(3/1) by Takeda Chemical Industries, Ltd., and Polyzol PSA SE-1400 and Vinyrol PSA AV-6200 series by Showa Kobunshi Co., Ltd. The amount of the adhesive to be used is about 1 through 8 $g/m^2$, preferably 2 through 6 $g/m^2$.

As described above, an adhesive can be used for lamination between a plastic film and a synthetic paper, between plastic films, between synthetic paper, or among plastic film, a synthetic paper and various types of paper and plastic film and synthetic paper.

To increase the strength of adhesion between the aforementioned substrate and heat insulating layer or dye image receiving layer, it is preferred that various types of primer treatment or corona discharging be applied to the surface of the substrate.

Of the substrates made of the materials described above, the substrate preferably used in the present invention is made of the resin coated paper having a thickness of 50 through 300 μm wherein both sides or either side of the paper is covered with plastic resin. From the viewpoint of getting a uniform image characterized by excellent smoothness and uniformity in coating, the substrate preferably used in the present invention is made of the resin coated paper having a thickness of 50 through 300 μm wherein both sides or either side of the paper is covered with polyolefin resin.

The following describes the resin coated film as an especially preferred support member wherein both sides or either side of the paper is covered with polyolefin resin:

The paper used for the resin coated paper of the present invention is mainly composed of wood pulp, and if required, the synthetic pulp such as polypropylene, or synthetic fiber such as nylon and polyester are used in addition to the wood pulp to manufacture the paper. Any one of LBKP, LBSP, NBKP, NBSP, LDP, NDP, LUKP and NUKP can be used as the wood pulp. Frequent use of the LBKP, NBSP, NBSP, LBSP, NDP and LDP containing a great number of short fibers is preferred. However, the ratio between the LBSP and/or LDP is preferably 10 through 70%. As the aforementioned pulp, the chemical pulp containing a small amount of impurities (sulfate pulp or sulfite pulp) is preferably used. The pulp having been bleached for improved whiteness is also used effectively.

If required, paper can contain a sizing agent such as higher fatty acid and alkylketene dimer, a white pigment such as calcium carbonate, talc and titanium oxide, a paper strength enhancing agent such as starch, polyacrylamide and polyvinyl alcohol, a fluorescent whitening agent, a moisture retention aid such as polyethylene glycol, a dispersant, and a softening agent such as quaternary ammonium.

The freeness of the pulp used to manufacture paper is preferably 200 through 500 ml according to the specification of CSF. The fiber length subsequent to beating degree is preferred to be such that the sum of the 24-mesh residue and 42-mesh residue designated in the JIS P 8207 will be 30 through 70%. The 4-mesh residue is preferably 20% or less.

Paper preferably has a basis weight of 50 through 300 g. It is particularly preferred to have a basis weight of 70 through 250 g. It preferably has a thickness of 50 through 300 μm.

Paper can be provided with calendering to improve smoothness in the paper manufacturing process or subsequent to paper manufacturing process. Paper density is commonly within the range from 0.7 through 1.2 $g/cm^3$ (JIS P 8118). The rigidity of base paper is preferably 20 through 200 g under the conditions designated in the JIS P 8143.

To improve moisture resistance, the paper surface can be coated with surface sizing agent. The surface sizing agent to be used for this purpose can be the same sizing agent that can be applied to the aforementioned base paper.

Paper has preferably a pH of 5 through 9 as measured according to the hot water sampling method designated in the JIS P 8113.

The following describes the polyolefin resin covering both sides or either side of the paper: The polyolefin resin use for this purpose includes polyethylene, polypropylene and polyisobutylene. Polyolefin such as a copolymer mainly composed of propylene is preferably used, and polyethylene is used for particular preference.

The following describes the particularly preferred polyethylene: The polyethylene for covering the obverse and/or reverse sides of paper is low-density polyethylene (LDPE) and/or high-density polyethylene (HDPE) in many cases. Other LLDPE and polypropylene can be used partly.

It is particularly preferred that titanium oxide of rutile or anatase structure be added to the polyolefin on the coated layer side to improve opacity and whiteness. The content of titanium oxide is generally 1 through 20% with respect to polyolefin, and is preferably 2 through 15%.

Highly heat-resistant coloring pigment or fluorescent whitening agent for adjusting the white background can be added to the polyolefin layer.

The coloring agent includes ultramarine blue pigment, Berlin blue, cobalt blue, phthalocyanine blue, manganese blue, cerulean blue, tungsten blue, molybdenum blue and anthraquinone blue.

The fluorescent whitening agent includes dialkylaminocoumarin, bisdimethylaminostilbene, bismethylaminostilbene, 4-alkoxy-1,8-naphthalene dicarboxylic acid-N-alkylimide, bisbenzoxazolyl ethylene and dialkylstilbene.

When both surfaces of paper is covered, the amount of the polyethylene used on the obverse and reverse sides is selected in such a way as to optimize the thickness of the film for all the layers on the side of the dye image receiving layer and the curling under the conditions of low humidity and high humidity after the back layers has been provided. Generally, the thickness of the polyethylene layer is 15 through 50 μm on the dye image receiving layer side and the thickness of the polyethylene layer is 10 through 40 μm on the back layer side. The ratio of polyethylene on the obverse and reverse side is preferably set in such a way as to adjust the curling that varies according to the type and thickness of the dye image receiving layer, as well as the thickness of the center stock. Normally, the ratio of the polyethylene on the obverse and reverse sides is approximately 3 to 1 through 1 to 3 in thickness.

Further, the support member covered with the aforementioned polyethylene has the following characteristics (1) through (7):

(1) Tensile strength is preferably 19.6 through 294 N in the longitudinal direction, and 9.8 through 196 N in the lateral direction in terms of the strength designated in the JIS P 8113.

(2) Tear strength is preferably 0.20 through 2.94 N in the longitudinal direction, and 0.098 through 2.45 N in the lateral direction in terms of the strength designated in the JIS P 8116.

(3) The modulus in compression is preferably 9.8 $kN/cm^2$.

(4) Opacity is 80% or more when measured according to the method designated in the JIS P 8138.

(5) The preferred whiteness is such that L*=80 through 96, a*=−3 through +5, and b*=−7 through +2 as designated in the JIS Z 8727.

(6) The support member is preferred to have the Clarke rigidity of 50 through 300 $cm^3/100$ in the direction in which recording paper is fed.

(7) The moisture content of the basis paper is preferably 4 through 10% with respect to the center stock.

(8) Glossiness (75-degree specular gloss) on the side where the dye image receiving layer is arranged is preferably 10 through 90%.

In the thermal transfer image receiving sheet of the present invention, various types of layers such as a heat insulating layer, an intermediate layer, an image receiving layer and others provided as required can be coated on the support member, using a desired method selected from the prior art methods. The preferred method is to coat the support member with the coating solution constituting each layer and to dry it. The coating method preferably used includes roll coating, rod bar coating, air knife coating, spray coating, curtain coating methods as well as the extrusion coating method using a hopper as described in U.S. Pat. No. 2,681,294.

(Heat Insulating Layer)

The thermal transfer image receiving sheet of the present invention is characterized in that a heat insulating layer containing hollow particles is provided on a substrate and the heat insulating layer and image receiving layer adjacent thereto are formed by simultaneous coating.

<Hollow Particle>

The hollow particle of the present invention includes the one wherein the hollow portion is formed by volatilization of the liquid inside the particle by heating, the one wherein the hollow portion is already formed before heating, and the one wherein the hollow portion is formed by evaporation and expansion of the liquid inside the particle. Any of them can be utilized. To ensure improved smoothness, the particles except for the one wherein the hollow portion is formed by evaporation and expansion is preferably used. The average size of the hollow particle used in the present invention is preferably 0.1 through 5.0 μm, more preferably 0.3 through 3.0 μm. The average diameter of the hollow particles refers to the value obtained by dividing the total of the circle-equivalent diameters of the portion forming the outer periphery of each particle image, by the number of particles measured, using at least 300 particle images, based on the image captured by a transmission electron microscope. The hollow volume ratio of the hollow particles used in the heat insulating layer of the present invention is preferably 30% or more.

The hollow volume ratio refers to the ratio P defined by the following formula (a) in the image of the aforementioned hollow particles obtained by the transmission electron microscope:

$$P = \left\{ 1/n \times \sum_{i=1}^{n} (R_{ai}/R_{bi})^{\wedge}3 \right\} \times 100(\%) \tag{a}$$

where symbols denote the following:

Rai: circle-equivalent diameter of the inner profile (hollow profile) out of two profiles constituting the image of a specific particle i;

Rbi: circle-equivalent diameter of the outer profile (External profile of the particle) out of two profiles constituting the image of a specific particle i;

n: number of particles measured (where n≧300)

If the hollow volume ratio is 30% or more, the heat insulation function will be more sufficient, and a higher printing density can be obtained.

the amount of the hollow particles contained in the heat insulating layer by mass is the percentage of hollow particles contained in the heat insulating layer by mass. The percentage of hollow particles contained refers to the percentage of the dry solid hollow particles with respect to the total of the mass of the nonvolatile component added to the coating solution constituting the heat insulating layer. The amount of the hollow particles in the heat insulating layer is preferably 65 or more without exceeding 90 percent by mass. If it is 65 percent or more by mass, the content of air bubbles will be sufficient, and a sufficient heat insulation effect can be ensured. If it is 90 percent or less by mass, bondage between particles will be more sufficient, and a sufficient strength of the coating film will be obtained. Alternatively, smoothness will be more sufficient by reducing local coagulation of the hollow particles, and this may lead to evener printing.

Further, in the present invention, the cross-linked hollow particles are preferably used to achieve a high-density printing characteristic. Cross-linking in the sense in which it is used here indicates that the resin constituting the shell of the hollow particle is cross-linked in one form or another. For example, in the case of the hollow particles mainly composed of styrene-acryl copolymers, cross-linking is provided by divinyl benzene when particles are synthesized. The following shows a guide for indicating the degree of cross linkage in the present invention: 100 mg of dry hollow particle is added to 100 ml of solution obtained by mixing methyl ethyl ketone with toluene at a ratio of 1 to 1 in terms of weight ratio, and the resulting solution is stirred for 8 hours in the normal temperature. The percentage of the solid residue subsequent to this procedure is preferably 60% or more. To put it more specifically, it can be exemplified by SX866B of JSR Co., Ltd. Of the hollow particles used in the heat insulating layer, the cross-linked hollow particles preferably contained is 3% or more when the mass of the total hollow particles is assumed as 100.

To provide whitening and masking functions and to adjust the feel of the material thermal transfer image receiving sheet, calcium carbonate, talc, karyon, titanium oxide, zinc oxide, other inorganic pigment or fluorescent whitening agent known in the prior art can be contained in the heat insulating layer containing the hollow particles as an inorganic pigment.

<Binder>

The following describes the binder used to form a heat insulating layer.

The binder that can be used for the heat insulating layer of the present invention can be either hydrophilic or hydrophobic. Alternatively, this binder can be characterized by a combination of hydrophilic and hydrophobic properties. The binder is preferred to be an emulsion resin having been subjected to emulsion polymerization by the high molecular dispersant containing a hydroxyl group or a hydrophilic binder.

In the emulsion resin having been subjected to emulsion polymerization by the high molecular dispersant containing a hydroxyl group as a hydrophobic binder, the high molecular dispersant is preferably a polyvinyl alcohol in particular. To manufacture films at a room temperature, it is preferred that the minimum film making temperature of the emulsion resin should not exceed 20 degrees Celsius. More preferably, this temperature should not exceed 5 degrees Celsius. The average particle size of the emulsion resin is preferably 0.01 through 2 μm, and more preferably 0.05 through 1.5 μm. Such an emultion resin available in the market includes a vinyl acetate based emulsion such as Vinyzol 480 and Vinyzol 2023 by Daido Kagaku Co., Ltd.; vinyl acetate based emulsion such as Vinybran 1108W and Vinybran 1084W or acryl based emulsion such as Vinybran 2597 and Vinybran 2561 by Nisshin Kagaku Kogyo Co., Ltd.; and vinyl acetate-ethylene based emulsion such as Smikaflex S-400 and Smikaflex S-405 by Sumitomo Chemical Industries Co., Ltd.

The hydrophilic binder used for the heat insulating layer of the present invention includes gelatine, polyvinyl alcohol, polyethylene oxide, polyvinyl pyrrolidone, Pullulan, carboxymethyl cellulose, hydroxyethyl cellulose, dextran, dextrin, polyacrylic acid and its salt, agar, κ-carageenan, λ-carageenan, τ-carageenan, casein, xanthene gum, locust bean rubber, alginic acid, Arabian rubber, polyalkylenoxide based copolymer and water soluble polyvinyl butyral described in the Official Gazette of Japanese Patent Tokkaihei 7-195826 and Official Gazette of Japanese Patent Tokkaihei 7-9757, and homopolymer or copolymer of the vinyl monomer containing carboxyl group and sulfonic acid group described in the Official Gazette of Japanese Patent Tokkaisho 62-245260. They are used independently or in combination of two or more. The hydrophilic binder preferably used in the present invention is polyvinyl alcohol or gelatine.

The aforementioned polyvinyl alcohol also includes the modified polyvinyl alcohol such as cation-modified polyvinyl alcohol, anion-modified polyvinyl alcohol containing anionic group and silyl-modified polyvinyl alcohol with the silyl group replaced.

The polyvinyl alcohol used in combination is preferred to have an mass-average degree of polymerization of 300 or more, and more preferred to have an average degree of polymerization of 1000 through 5000 in particular. The degree of saponification is preferably 70 to 100 mol %, and more preferably 80 through 99.5 mol %. It should be noted that the average degree of polymerization refers to the mass-average degree of polymerization unless otherwise specified.

When other hydrophilic binder or hydrophobic binder is used in combination, the percentage of an emulsion resin having been subjected to emulsion polymerization by high molecular dispersant containing the hydroxyl group included in the binder is preferably 5 mass percent or more, and more preferably 10 mass percent in particular.

A cationic polymer can be used in the heat insulating layer of the present invention. The cationic polymer has primary through tertiary amines, quaternary ammonium salt or quaternary phosphonium base arranged on the principal chain or side chain of the polymer.

The examples of the cationic polymer used in the present invention include polyethylene imine, polyallyl amine, polyvinyl amine, dicyandiamide polyalkylene polyamine condensate, polyalkylene polyamine dicyandiamide ammonium salt condensate, dicyandiamide formalin condensate, epichlorohydrin-dialkyl amine-added polymer, diallyldimethyl ammonium chloride polymer, diallyldimethyl ammonium chloride polymer-$SO_2$ copolymer, polyvinyl imidazole, vinylpyrrolidone-vinyl imidazole copolymer, polyvinyl pyridine, polyamine, chitosan, cationic starch, vinylbenzyl trimethyl ammonium chloride polymer, (2-methacryloxyoxyethyl) trimethyl ammonium chloride polymer, and dimethyl aminoethyl methacrylate polymer.

The cationic polymer that can be used in the present invention is preferably the cationic polymer impervious to swelling. The cationic polymer obtained by copolymerization of acrylic acids is preferred in particular. The preferred acrylic acids include acrylic acid esters and acrylamide. Further, butylacrylate and hydroxyethylmethyl acrylate are preferred.

Examples include the cationic polymer described in the Kagaku Kogyo Jiho (Chemical Industrial Times) issued on Aug. 15 and 25, 1998 and the high molecular dye binder described in "Primer to high molecular chemicals" by Sanyo Chemical Industries, Ltd.

The mass-average molecular weight that can be used in the present invention is preferred to be within the range from 2,000 through 500,000. It is more preferred to be within the range from 3,000 through 100,000.

The cationic polymer that can be used in the present invention may be coated and dried after having been added to the coating solution. Alternatively, the heat insulating layer may be applied to the film having been coated and dried, with the aqueous solution impregnated therewith. Further, there is also a method of adding the polymer before drying, after application of the heat insulating layer. This method includes curtain coating, spray coating and other coating methods.

When the cationic polymer that can be used in the present invention is added to the coating solution in advance, it can be uniformly added to the coating solution. Not only that, it can be added so as to form composite particles with the inorganic fine particles. The technique of producing composite particles using inorganic fine particles and cationic polymer include a method of mixing the inorganic fine particles with cationic polymer for coating by adsorption, a method of coagulating the coated particles to get higher-order composite particles, and a method of changing bulky particles obtained by mixing, into uniform composite particles using a homogenizer.

The cationic polymer that can be used in the present invention generally contains a water soluble group, and is therefore soluble in water. However, it may not dissolve in water, for example, by composition of copolymer components. The cationic polymer is preferred water-soluble from the viewpoint of manufacturing ease. Even if it does not easily dissolve in water, it can be used after having been dissolved by water miscible organic solvent.

The aforementioned water miscible organic solvent includes alcohols such as methanol, ethanol, isopropanol and n-propanol; glycols such as ethylene glycol, diethylene glycol and glycerin; esters such as ethyl acetate and propyl acetate; ketenes such as acetone and methyl ethyl ketone; amides such as N,N-dimethyl formamide; and organic solvents capable of dissolving in water 10 percent or more.

The normally preferred amount of cationic polymer is 0.1 through 10 g for 1 $m^2$ of thermal transfer image receiving sheet. The more preferred amount is 0.2 through 5 g.

<Hardening Agent>

Hardening agent can be contained in the thermal transfer image receiving sheet of the present invention when the heat insulating layer is formed. The hardening agent can be added at a desired time during the production of the thermal transfer image receiving sheet. For example, it can be added in the coating solution used for formation of the heat insulating layer.

The hardening agent usable in the present invention has not restriction imposed thereto, as long as it reacts with the binder to harden the film. The preferred hardening agent includes boric acid, its salt and epoxy-based hardening agent. Other commonly known agents can be used. Such an agent generally includes the compound having a group capable of reacting with the hydrophilic binder, and the compound for promoting reaction among different groups owned by the hydrophilic binder. It can be selected and used as appropriate, according to the type of the binder. Specific examples of the hardening agent include:

epoxy based hardening agents (diglycidyl ethyl ether, ethylene glycol diglycidyl ether, 1,4-butanediol diglycidyl ether, 1,6-diglycidyl cyclohexane, N,N-diglycidyl-4-glycidyl oxyaniline, sorbitol polyglycidyl ether and glycerol polyglycidyl ether);

aldehyde based hardening agents (formaldehyde and glyoxal);

activated halogen based hardening agents (2,4-dichloro-4-hydroxy-1,3,5-s-triazine);

activated vinyl based compounds (1,3,5-trisacryloyl-hexahydro-s-triazine, bis-vinylsulfonyl methyl ether);

isocyanate based compounds;

zirconyl sulfate; and aluminum alum.

The boric acid or its salt refers to the oxyacid with a boron atom as a center atom, and its salt thereof. To put it more specifically, it includes orthoboric acid, diborate, metaboric acid, tetraboric acid, pentaboric acid, octaboric acid and the salts thereof.

The boric acid containing a boron atom as a hardening agent, and the salt thereof can be used as an independent organic solvent solution, aqueous solution or as a mixture of two or more. An aqueous mixture of boric acid and borax is particularly preferred.

Each of the boric acid and borax can be added in the form of a dilute aqueous solution. If they are mixed, they can be made into a concentrated aqueous solution, and the coating solution can be concentrated. Further, the pH value of the aqueous solution to be added can be controlled with comparative freedom. The overall amount of the aforementioned hardening agent used is preferably 1 through 1000 mg for 1 g of the aforementioned binder.

(Intermediate Layer)

The layer adjacent to the heat insulating layer of the present invention is an intermediate layer in the preferable embodiment.

In the present invention, an intermediate layer is preferably provided between the heat insulating layer and image receiving layer according to the present invention on a substrate.

Examples of the functions provided by the intermediate layer according to the present invention include, without being restricted to, resistance to solvent, barrier function for keeping pigment on the image receiving layer without allowing the pigment to spread over to the layer lying thereunder, bonding function, whitening function, concealing function and antistatic function. All the heretofore known intermediate layers can be utilized.

To provide the intermediate layer with resistance to solvent and barrier function, use of water soluble resin is preferred. The water soluble resin includes: cellulose based resin such as carboxymethyl cellulose; polysaccharide based resin such as starch; proteins such as casein; gelatine; agar; vinyl based resins such as polyvinyl alcohol, ethylene vinyl acetate copolymer, polyvinyl acetate, polyvinyl chloride, vinyl acetate copolymer (e.g. Beopa by Japan Epoxy Resin Co., Ltd.), vinyl acetate(meth)acryl copolymer, (meth)acryl resin, styrene(meth)acryl copolymer and styrene resin; polyamide based resin such as melamine resin, urea resin, benzoguanamine; polyester; and polyurethane. What is called water soluble resin in this description refers to the resin that:

completely dissolves in the solvent mainly composed of water (particle diameter: 0.01 μm or less);

gets in the state of colloidal dispersion (particle diameter: 0.01 through 0.1 μm);

is emulsified (particle diameter: 0.1 through 1 μm); or is changed into slurry (particle diameter: 1 μm or more).

What are particularly preferred in these water soluble resins are the ones that are not dissolved or swollen by alcohols such as methanol, ethanol and isopropyl alcohol; and general-purpose solvents such as hexane, cyclohexane, acetone, methyl ethyl ketone, xylene, ethyl acetate, butyl acetate and toluene. In this sense, the resin that completely dissolves in the solvent mainly composed of water is most preferred. In particular, polyvinyl alcohol resin and cellulose resin can be mentioned.

To provide the intermediate layer with bonding function, urethane resins and polyolefin resins are generally used although they vary according to the type of the substrate sheet and the method of surface treatment. Further, when the thermoplastic resin having activated hydrogen and the curing agent such as isocyanate compound are used in combination, excellent bonding performance is ensured. To provide the intermediate layer with whitening function, a fluorescent whitening agent can be used. The fluorescent whitening agent to be used can be any of the compounds known in the prior art. The fluorescent whitening agent can be based on stilbene, distilbene, benzooxazole, styryl-oxazole, pyrene oxazole, coumalin, amino coumalin, imidazole, benzoimidazole, pyrazoline and distyryl-biphenyl. The whiteness can be adjusted by the type of the fluorescent whitening agent and the amount to be added. The fluorescent whitening agent can be added by any method. To be more specific, it can be added after having been:

dissolved in water;

pulverized and dispersed by a ball mill and colloid mill;

dissolved in the solvent having a high boiling point and mixed with hydrophilic colloidal solution so that it is added as underwater oil drop type dispersions;

impregnated with high molecular latex.

Further, to conceal glare or irregularities of the substrate sheet, titanium oxide may be applied to the intermediate layer. Use of the titanium oxide increases the degree of freedom in the selection of the substrate sheet. Titanium oxide is available in two types; titanium oxide of rutile structure and titanium oxide of anatase structure. From the viewpoint of the whiteness and the effect of the fluorescent whitening agent, the titanium oxide of anatase structure having a shorter wavelength in the absorption of ultraviolet portion is used in preference over the titanium oxide of rutile structure. When the binder resin of the intermediate layer is water-based and dispersion of titanium oxide is difficult, it is possible to use the titanium oxide whose surface is provided with hydrophilic treatment. Alternatively, it is also possible to use the known dispersant such as surface active agent and ethylene glycol for dispersion. The amount of the titanium oxide to be added is preferably 100 through 400 parts by mass of solid titanium oxide, with respect to 100 parts by mass of solid resin.

To provide the intermediate layer with antistatic function, an inorganic conducting feeler, organic conducting material such as polyaniline sulfonic acid, or conducting materials known in the prior art can be selectively used. Such an intermediate layer is preferably set within the range from 0.1 through 10 μm.

(Image Receiving Layer)

The image receiving layer of the present invention is defined as the layer for receiving pigments and forming an image. The image receiving layer of the present invention preferably contains a mold releasing agent and a metal ion-containing compound capable of forming a chelate compound through reaction with a dye capable of forming a chelate, in addition to the binder resin. The following describes the details of the binder resin usable in the image receiving layer of the present invention, the metal ion-containing compound capable of forming a chelate compound through reaction with a dye capable of forming a chelate, and mold releasing agent.

<Binder Resin>

Any binder resin known in the prior art can be used as a binder resin used in the image receiving layer of the present invention. It is preferred to use a binder that can be easily colored with a pigment (hereinafter referred to as "dye"). To put it more specifically, the examples of such a binder include a polyolefin resin such as polypropylene; a halogenated resin such as polyvinyl chloride and polyvinylidene chloride; a vinyl resin such as polyvinyl acetate and polyacrylic ester; a polyester resin such as polyethylene terephthalate and polybutylene terephthalate; polystyrene resin, polyamide resin, phenoxy resin, copolymer between olefin such as ethylene and propylene and other vinyl, polyurethane, polycarbonate, acryl resin, ionomer resin, cellulose derivative as a simple structure and a mixture. Of these substances, the vinyl resin is preferred, and the polyester resin, cellulose resin and polycarbonate are most preferred.

The other binder resin can be any one of the hydrophobic binder described with reference to the aforementioned heat insulating layer, the hydrophilic binder to be described below, and a combination of the two.

The hydrophilic binder usable in combination includes gelatine, polyvinyl alcohol, polyvinyl pyrrolidone, polyethylene oxide, hydroxyethyl cellulose, agar, Pullulan, dextrin, acrylic acid, carboxymethyl cellulose, casein, alginic acid. They can also be used in combination. Of these, polyvinyl alcohol or gelatine is preferably used.

The aforementioned polyvinyl alcohol also includes the modified polyvinyl alcohol such as cation-modified polyvinyl alcohol, anion-modified polyvinyl alcohol having an anionic group, polyvinyl acetal resin with acetal introduced therein, and silyl-modified polyvinyl alcohol with silyl group replaced.

The polyvinyl alcohol used in combination is preferred to have an average degree of polymerization of 300 or more. Especially the polyvinyl alcohol having an average degree of polymerization of 1000 through 5000 is preferably used. It is preferred to have a degree of saponification of 70 through 100 mol %, and is particularly preferred to have a degree of saponification of 80 through 99.5 mol %.

When used in combination with other hydrophilic binder or hydrophobic binder, the percentage of the emulsion resin having been subjected to emulsion polymerization by the high molecular dispersant containing the hydroxyl group included in the binder is preferably 5% or more by mass, and is more preferably 10% or more by mass in particular.

The cationic polymer of the present invention includes the same examples used as the cationic polymer that can be used in the aforementioned heat insulating layer.

The cationic polymer of the present invention has a water soluble group and is generally water-soluble. However, it may not dissolve in water, depending on the type of the composition of the copolymer components. From the viewpoint of ease in manufacture, it is preferred to be water soluble. Even if it does not easily dissolve in water, it can be dissolved by an organic water miscible solvent.

The aforementioned organic water miscible solvent refers to alcohols such as methanol, ethanol, isopropanol and n-propanol; glycols such as ethylene glycol, diethylene glycol and glycerine; esters such as ethyl acetate and propyl acetate; ketenes such as acetone and methyl ethyl ketone; amides such as N,N-dimethyl formamide; and organic solvents capable of dissolving in water 10 percent or more. In this case, it is preferred that the amount of the organic solvent should not exceed the amount of water used.

It is normally preferred that the amount of cationic polymer is 0.1 through 10 g per square meter of the thermal transfer image receiving sheet. The more preferred amount is 0.2 through 5 g.

<Metal Ion-containing Compound Capable of Forming a Chelate Compound Through Reaction with a Dye Capable of Forming a Chelate>

To improve the image keeping quality subsequent to printing in the thermal transfer image receiving sheet of the present invention, it is preferred that the image receiving layer should contain a metal ion-containing compound capable of forming a chelate compound through reaction with a dye capable of forming a chelate (hereinafter referred to as "metal source"). The metal source is exemplified by inorganic or organic salts of metal ion and metal complex. Any of these substances can be used preferably. Such a metal includes the monovalent or polyvalent metals pertaining to Groups I through VIII of the periodic table. Of these metals, Al, Co, Cr, Cu, Fe, Mg, Mn, Mo, Ni, Sn, i and Zn are preferred, and Ni, Cu, Cr, Co and Zn are particularly preferred.

Specific examples of the source metals are inorganic substances with $Ni^{2+}$, $Cu^{2+}$, $Cr^{2+}$ $Co^{2+}$ and $Zn^{2+}$, salts of aliphatic group such as acetic acid and stearic acid, and salts of aromatic carboxylic acid such as benzoic acid and salicylic acid.

In the present invention, the complex that can be expressed by the following general equation (I) can be added to the image receiving layer under stable conditions and is substantially colorless. Accordingly, such a complex is preferred used.

General equation (I)

$$[M(Q_1)_X(Q_2)_Y(Q_3)_Z]^{P+}(L^-)_P$$

where M denotes a metal ion, preferably $Ni^{2+}$, $Cu^{2+}$, $Cr^{2+}$, $Co^{2+}$ or $Zn^{2+}$. $Q_1$, $Q_2$ and $Q_3$ denote the coordinate compound capable of coordinate bondage with the metal ion represented by M. They can be the same or different from each other. These coordinate compounds can be selected from the coordinate compounds described in "Science of Chelate (5)" (Nankodo Co., Ltd.). "L−" indicates the organic anion group. To put it more specifically, tetraphenyl boric acid anion and alkylbenzene sulfonic acid anion can be mentioned. "X" indicates an integer 1, 2 or 3, and "Z" denotes 1 or 0. They are determined by whether the complex expressed by the aforementioned general equation is a tetradentate or hexadentate ligand. Alternatively, they are determined by the number of the ligands $Q_1$, $Q_2$ and $Q_3$. "P" represents 1 or 2. Specific examples of this kind of metal source include the ones disclosed in the Specification U.S. Pat. No. 4,987,049 or the compounds 1 through 51 the Official Gazette of Japanese Patent Tokkaihei 10-7181.

MS Exemplified Compounds (1)

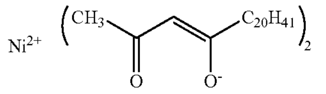

(2)

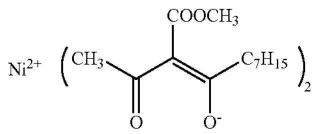

(3)

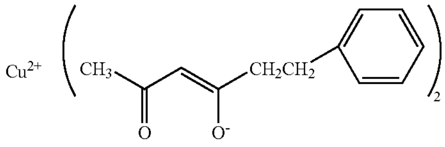

(4)

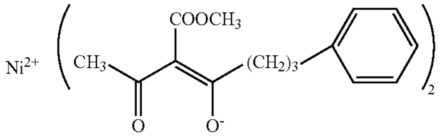

(5)

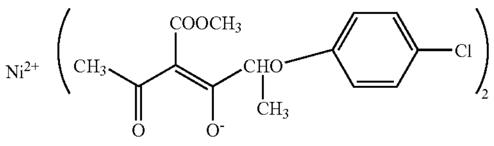

(6)

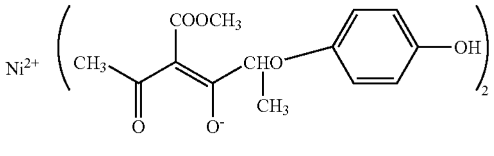

-continued (7)

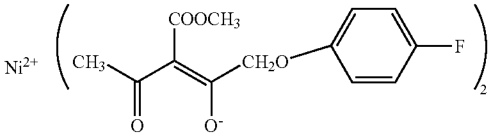

(8)

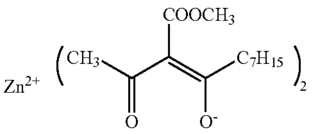

The amount of metal source to be added is preferably 5 through 80% by mass with respect to the binder of the image receiving layer, and more preferably 10 through 70% by mass. The added amount of the metal source used in the present invention is preferably 0.5 through 20 g/$m^2$, and more preferably 1 through 15 g/$m^2$.

<Mold Releasing Agent>

In the image receiving layer of the present invention, a mold releasing agent is preferably contained to avoid thermal fusion with the ink layer of the thermal transfer image receiving sheet at the time of printing.

The mold releasing agent that can be put into use includes a phosphoric acid ester based plasticizer, fluorine based compound and silicone oil (including the silicone that is cured by reaction). Of these, silicone oil is preferably used. As such a silicone oil, various modulated silicones including dimethyl silicone can be used. To put it more specifically, amino-modulated silicone, epoxy-modulated silicone, alcohol-modulated silicone, vinyl-modulated silicone, and urethane-modulated silicone are used. They are blended or polymerized through various forms of reaction. The preferable amount of mold releasing agent to be added is 0.5 through 30 parts by mass with respect to 100 parts by mass of image receiving layer forming resin. Keeping the amount of mold releasing agent within this range will make it less likely to raise such a problem as fusion between the thermal transfer image receiving sheet and the image receiving layer of the image receiving sheet, or deterioration in the printing sensitivity. The aforementioned mold releasing agent can be separately provided as a mold releasing layer on the image receiving layer, without the image receiving layer directly added to the image receiving layer.

In the present invention, use of the silicone-based emulsion type mold releasing agent is also preferred. The silicone-based emulsified mold releasing agent is obtained by emulsifying silicone oil using various forms of emulsifier. It is preferred to be silicone-based emulsified mold releasing agent of oil emulsion (O/W), or KM786, KM785 and KM860A by Shinetsu Chemical Co. Ltd., to put it more specifically. The silicone-based emulsified mold releasing agent of the first or second class is utilized. It can be used in combination with other silicone oil-based mold releasing agent.

<Surface Active Agent>

The image receiving layer of the present invention preferably contains the silicone based surface active agent.

The silicone based surface active agent known in the prior art can be used in the present invention. For example, it is preferred to use the silicone based surface active agent introduced in Chapter 6, "Functional Surface Active Agent" supervised by M. Sumita, issued in August 2000. To put it more specifically, EMALEX SS-5050K and EMALEX SS-5602 by Nippon Emulsion Co., Ltd. can be mentioned.

The image receiving layer of the present invention is preferred to contain the fluorine based surface active agent.

The fluorine based surface active agent known in the prior art can be used in the present invention. For example, the fluorine based surface active agent introduced in Chapter 5, "Functional Surface Active Agent" supervised by M. Sumita, issued in August 2000 can be used preferably. Futagent series by Neos Co., Ltd. and FC-4430 by Sumitomo 3M Limited can be mentioned as specific fluorine based surface active agents.

The layer adjacent to the heat insulating layer of the present invention is the image receiving layer in the preferable embodiment.

(Coating Method)

The thermal transfer image receiving sheet manufacturing method according to the present invention is characterized in that the heat insulating layer and a layer adjacent to the heat insulating layer (e.g. the aforementioned intermediate layer or image receiving layer) are formed by simultaneous multilayer coating. In this case, it is also possible to make such arrangements that simultaneous multi-layer coating of the heat insulating layer and intermediate layer is completed first, and is followed by the step of coating the image receiving layer. Alternatively, simultaneous coating of the heat insulating layer and image receiving layer is performed, without the intermediate layer being provided. Alternatively, heat insulating layer, intermediate layer and image receiving layer are simultaneously coated.

In the present invention, simultaneous multi-layer coating can be defined as a method of simultaneously supplying a plurality of coating solutions constituting different layers, thereby forming the layers. Accordingly, the simultaneous multi-layer coating does not include the method of coating several times without drying, namely, the method of multilayer coating on the wet-on-wet basis followed by the step of simultaneous drying.

The heat insulating layer and the layer to be coated simultaneously therewith are preferably formed by water-based coating method, from the viewpoint of protecting the surface of the resin wall of the hollow particles. Other constituent layer provided as required can be formed according to an appropriate method selected from the techniques known in the prior art.

No restriction is imposed on the coating method applicable in the present invention. For example, the roll coating method, rod bar coating method, air knife coating method, spray coating method, curtain coating method, or extrusion coating method using a hopper described in the U.S. Pat. No. 2,681,294 is preferably used. When two or more layers of coating solutions are simultaneously coated, the viscosity of the coating solution constituting the bottom layer is assumed as $\eta 1$ the viscosity of the coating solution of each constituent layer except for the bottom layer is assumed as $\eta 2$. Based on this assumption, coating is performed under such a condition as to meet the relationship $\eta 2 > \eta 1$. This procedure is preferred for formation of a uniform and homogeneous coated film. The viscosity of each coating solution can be easily adjusted by adding the thickener and thinner known in the prior art, for example, the water soluble thicker mainly composed of styrene sodium salt maleate copolymer or alcohols and inorganic salts, without affecting other performances. In the simultaneous multi-layer coating, the static and dynamic surface tension of the coating solution constituting the layer in a lower position should be equal to or greater than that of the coating solution constituting the layer in a higher position. This is a preferred requirement for ensuring excellent coating performances. In the present invention, the surface tension of the coating solution can be adjusted by addition of various forms of surface active agent, for example, a fluorine based surface active agent.

In the present invention, the temperature of the coating solution for the heat insulating layer and a layer to be coated simultaneously therewith is preferred to be within the range from 25 through 90 degrees Celsius. It is more preferred to be within the range from 30 through 80 degrees Celsius.

For formation of a more uniform and homogeneous film, it is preferred to provide a step of cooling and setting the coated film (hereinafter referred to as "cooling/setting step" or "setting step") before starting the step of drying after termination of coating. The setting step is defined as a step of gellation by increasing the viscosity of the composition of the coated film, for example, by applying cold air to the coated film and reducing the temperature, whereby the substance flowability between layers and inside each layer is slowed down. The preferred temperature for using cold air is equal to or smaller than 25 degrees Celsius, and the more preferred temperature is equal to or smaller than 10 degrees Celsius. The preferred time for the coated film to be exposed to cold air is 10 or more without exceeding 120 sec., although it depends on the coating solution feed rate. To improve the setting property of the coating solution, it is preferred to use the method of adding a gelling agent known in the prior art, such as gelatine, pectin, agar, carageenan and Gellan Gum, in addition to the method of increasing the percentage of the binder by mass in the coating solution.

The following describes the thermal transfer ink sheet used together with the thermal transfer image receiving sheet of the present invention in the case of forming an image:

<<Thermal Transfer Ink Sheet>>

(Substrate Sheet)

In the present invention, the substrate sheet used as the thermal transfer ink sheet can be made of the material known in the prior art under the name of a substrate sheet. A preferred substrate sheet is made of an oriented or unoriented plastic film and a lamination of the following materials: thin paper such as glassine paper, capacitor paper and paraffin paper; heat-resistant polyester such as polyethylene terephthalate, polyethylene naphthalate, polybutylene terephthalate, polyphenylene sulfide, polyether ketone and polyether sulfone; polypropylene, fluorine resin, polycarbonate, cellulose acetate, polyethylene derivatives, polyvinyl chloride, polyvinylidene chloride, polystyrene, polyamide, polyimide, polymethyl pentene, and ionomer. The thickness of this substrate sheet can be selected adequately in accordance with the material to ensure the proper strength and heat resistance. Usually, the thickness is preferably in the range from 1 through 100 μm.

In the case of poor adhesion with the ink layer formed on the surface of the substrate sheet, the surface is preferably provided with primer treatment or corona treatment.

(Ink Layer and Pigment)

In the present invention, the ink layer constituting the thermal transfer ink sheet is a thermally sublimable pigment layer containing at least pigment and binder. The pigment used in the ink layer in the present invention can be used singly or in combination with two or more.

The following describes the pigment applicable in the present invention:

In the present invention, the pigment-containing area applicable to the thermal transfer ink sheet can be two or more color-containing areas different from each other in hue.

For example, (1) the pigment-containing area is composed of the area containing a yellow pigment, the area containing a magenta pigment, and the area containing a cyan pigment; and the areas not containing a pigment are formed next to these pigment-containing areas. (2) The pigment-containing area is composed of the ink layer containing a black pigment, and the area not containing a pigment is formed next to this area. (3) The pigment-containing area is composed of the area containing a yellow pigment, the area containing a magenta pigment, the area containing a cyan pigment, and the area containing a black pigment; and the area not containing a pigment is formed next to these pigment-containing areas.

No restriction is imposed on the pigment applicable to the thermally sublimable pigment. It includes all the pigments used in thermal transfer ink sheet of thermally-sensitive sublimable transfer method known in the prior art, as exemplified by azo-, azomethine-, methine-, anthraquinone-, quinophthalone- and naphtoquinone-based pigments. To put it more specifically, the yellow pigments are exemplified by Phorone Brilliant Yellow 6GL, PTY-52, and Macrorex Yellow 6G. The examples of red pigments include MS Red G, Macrorex Red Violet R, Celes Red 7B, Samaron Red HBSL, and SK Rubin SEGL. The blue pigments include Kayaset Blue 714, Wakusorin Blue AP-FW, Phorone Brilliant Blue S-R, MS Blue-100 and Dyte Blue No. 1.

Further, no restriction is imposed on the thermally diffusive pigment capable of forming a chelate, if thermal transfer is possible. Various types of compounds known in the prior art can be selected for use. It is possible to use the cyan pigment, magenta pigment and yellow pigment described in the Official Gazette of Japanese Patent Tokkaisho 59-78893, the Official Gazette of Japanese Patent Tokkaisho 59-109349, the Official Gazette of Japanese Patent Tokkaihei 4-94974, the Official Gazette of Japanese Patent Tokkaisho 4-97894, and the Specification of Patent No. 2856225.

The compound expressed by the following general formula can be mentioned as a chelate cyan pigment:

[Chemical Formula 1]

General formula (1)

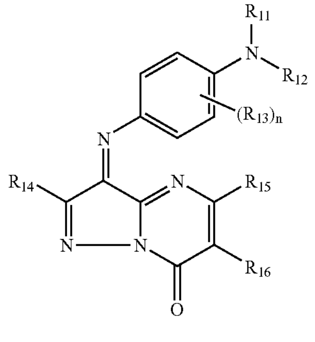

In the aforementioned general formula (1), $R_{11}$ and $R_{12}$ denote unsubstituted and substituted aliphatic groups, respectively. $R_{11}$ and $R_{12}$ may be the same or different from each other. For example, the aliphatic group includes an alkyl group, cycloalkyl group, alkenyl group and alkynyl group. The alkyl group includes a methyl group, ethyl group, propyl group and i-propyl group. The group capable of replacing these alkyl group includes:

an alkyl group of straight chain or branched chain (e.g. methyl group, ethyl group, i-propyl group, t-butyl group, n-dodecyl group and 1-hexylnonyl group);

a cycloalkyl group (e.g. cyclopropyl group, cyclohexyl group, bicyclo[2,2,1]heptyl group, and adamantyl group);

an alkenyl group (e.g. 2-propylene group and oleyl group);

an aryl group (e.g. phenyl group, orthotolyl group, orthoanisyl group, 1-naphthyl group and 9-anthranyl group);

a heterocyclic ring group (e.g. 2-tetrahydrofuryl group, 2-thiophenyl group, 4-imidazolyl group and 2-pyridyl group)

a halogen atom (e.g. fluorine atom, chlorine atom and bromine atom);

a cyano group;

a nitro group;

a hydroxy group;

a carbonyl group (e.g. alkylcarbonyl group such as acetyl group, trifluoro acetyl group and pivaloyl group; aryl carbonyl group such as benzoyl group, pentafluorobenzoyl group and 3,5-di-t-butyl-4-hydroxybenzoyl group);

an oxycarbonyl group (e.g. alkoxy carbonyl group such as methoxy carbonyl group, cyclohexyloxy carbonyl group and n-dodecyloxy carbonyl group; aryloxy carbonyl group such as phenoxy carbonyl group, 2,4-di-t-amylphenoxy carbonyl group and 1-naphthyloxy carbonyl group; heterocyclic ring oxycarbonyl group such as 2-pyridyloxy carbonyl group and 1-phenylpyrazolyl-5-oxy carbonyl group);

a carbamoyl group (e.g. alkylcarbamoyl group such as dimethylcarbamoyl group, 4-(2,4-di-t-amylphenoxy), and butylaminocarbonyl group), and arylcarbamoyl group such as phenylcarbamoyl group and 1-naphthylcarbamoyl);

an alkoxy group (e.g. methoxy group and 2-ethoxyethoxy group);

an aryloxy group (e.g. phenoxy group, 2,4-di-t-amylphenoxy group, and 4-(4-hydroxyphenyl sulfonyl)phenoxy group);

a heterocyclic ring oxy group (e.g. 4-pyridyloxy group and 2-hexahydro pyranyloxy group)

a carbonyloxy group (e.g. alkyl carbonyloxy group such as acetyloxy group, trifluoroacetyloxy group, and pivaloyloxy group; and aryloxy group such as benzoyloxy group and pentafluorobenzoyloxy group);

an urethane group (e.g. alkyl urethane group such as N,N-dimethylurethane group; and aryl urethane group such as N-phenylurethane group and N-(p-cyanophenyl)urethane group);

sulfonyloxy group (e.g. alkylsulfonyloxy group such as methane sulfonyloxy group, trifluoro methane sulfonyloxy group, and n-dodecan sulfonyloxy group; and arylsulfonyloxy group such as benzene sulfonyloxy group, p-toluene sulfonyloxy group)

an amino group (e.g. alkylamino group such as dimethylamino group, cyclohexyl amino group and n-dodecyl amino group; and arylamino group such as anilino group and p-t-octylanilino group);

a sulfonyl amino group (e.g. alkylsulfonyl amino group such as methane sulfonylamino group, heptafluoropropanesulfonyl amino group and n-hexadesylsulfonyl amino group; and aryl sulfonyl amino group such as p-toluene sulfonyl amino group and pentafluorobenzene sulfonyl amino group;

a sulfamoyl amino group (e.g. alkylsulfamoyl amino group such as N,N-dimethylsulfamoyl amino group; arylsulfamoyl amino group such as N-phenylsulfamoyl amino group)

an acyl amino group (e.g. alkylcarbonyl amino group such as acetyl amino group and myristoyl amino group; and arylcarbonyl amino group such as benzoyl amino group);

an ureide group (e.g. alkyl ureide group such as N,N-dimethylamino ureide group; aryl ureide group such as N-phenylureide group, N-(p-cyanophenyl) ureide group);

a sulfonyl group (e.g. alkyl sulfonyl group such as methane sulfonyl group and trifuoro methane sulfonyl; and arylsulfonyl group such as p-toluene sulfonyl group);

a sulfamoyl group (e.g. alkyl sulfamoyl group such as dimethylsulfamoyl group and 4-(2,4-di-t-amylphenoxy) butylamino sulfonyl group; and aryl sulfamoyl group such as phenylsulfamoyl group);

an alkylthio group (e.g. methylthio group and t-octylthio group);

an arylthio group (e.g. phenylthio group); and a heterocyclic ring thio group (e.g. 1-phenyltetrazol-5-thio group, and 5-methyl-1,3,4-oxadiazole-2-thio group).

The examples of the cycloalkyl group and alkenyl group are the same as the aforementioned substituents. The alkynyl group is exemplified by 1-propyn, 2-butyne and 1-hexyne.

The group that forms a non-aromatic cyclic configuration (e.g. pyrrolidine ring, piperidine ring, morpholine ring, etc.) is preferably used as the $R_{11}$ and $R_{12}$.

Of the aforementioned substituents, the alkyl group, cycloalkyl group, alkoxy group and acylamino group are preferably used as $R_{13}$. "n" denotes an integer from 0 through 4. When n is 2 or more, a plurality of $R_{13}$'s can be the same or different from one another.

"$R_{14}$" denotes an alkyl group, which is exemplified by a methyl group, ethyl group, i-propyl group, t-butyl group, n-dodecyl group and 1-hexylnonyl group. A secondary or tertiary alkyl group is preferably used as "$R_{14}$". The secondary or tertiary alkyl group preferably used is exemplified by isopropyl group, sec-butyl group, tert-butyl group and 3-heptyl group. The most preferable substituent as the $R_{14}$ includes an isopropyl group and a tert-butyl group. The alkyl group of $R_{14}$ can be replaced. They are all replaced by the substituent composed of the carbon atom and hydrogen atom; they are not replaced by the substituent including other atoms.

"$R_{15}$" denotes an alkyl group, and is exemplified by the n-propyl group, i-propyl group, t-butyl group, n-dodecyl group and 1-hexylnonyl group. The $R_{15}$ is preferably a secondary or tertiary alkyl group, which is represented by an isopropyl group, sec-butyl group, tert-butyl group and 3-heptyl group. The most preferable substituent as the $R_{15}$ is an isopropyl group and tert-buryl group. The alkyl group of the $R_{15}$ can be replaced. It is entirely replaced by the substituent composed of a carbon atom and hydrogen atom, not by the substituent containing other atoms.

The $R_{16}$ denotes an alkyl group, and is exemplified by the n-propyl group, n-butyl group, n-pentyl group, n-hexyl group, n-heptyl group, isopropyl group, sec-butyl group, tert butyl group, and 3-heptyl group. The substituent particularly preferably used as the $R_{16}$ is the alkyl group of three or more straight chains. It is exemplified by the n-propyl group, n-butyl group, n-pentyl group, n-hexyl group and n-heptyl group. The n-propyl group and n-butyl group are most preferably used. The alkyl group of the $R_{16}$ can be replaced. It is entirely replaced by the substituent composed of a carbon atom and hydrogen atom, not by the substituent containing other atoms.

The chelate yellow pigment includes the compound expressed by the following general formula (2):

[Chemical Formula 2]

General formula (2)

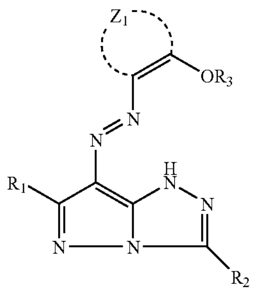

In the aforementioned general formula (2), the substituents represented as $R_1$ and $R_2$ include: a halogen atom; a alkyl group (alkyl group having a carbon number of 1 through 12 wherein the substituent coupled by the oxygen atom, nitrogen atom, sulfur atom or carbonyl group is replaced, or aryl group, alkenyl group, alkynyl group, hydroxyl group, amino group, nitro group, carboxyl group, cyano group, or halogen atom can be replaced by other substituent. For example, methyl, isopropyl, t-butyl, trifluoromethyl, methoxymethyl, 2-methanesulfonylethyl, 2-methanesulfoneamideethyl, cyclohexyl groups); an aryl group (e.g. phenyl, 4-t-butylphenyl, 3-nitrophenyl, 3-acylaminophenyl, 2-methoxyphenyl groups); cyano group, alkoxyl group, allyloxy group, acylamino group, anilino group, ureide group, sulfamoyl amino group, alkylthio group, arylthio group, alkoxycarbonyl amino group, sulfoneamide group, carbamoyl group, sulfamoyl group, sulfonyl group, alkoxy carbonyl group, heterocyclic ring oxy group, acyloxy group, carbamoyloxy group, silyloxy group, aryloxy carbonyl amino group, imide group, heterocyclic ring thio group, phosphonyl group, and acyl group.

The same substances as those of the alkyl group and aryl group indicated by $R_1$ and $R_2$ can be mentioned as those of the alkyl group and aryl group indicated by $R_3$.

A 5- and 6-membered aromatic ring, formed together with two carbon atoms, represented by $Z_1$, includes rings of benzene, pyridine, pyrimidine, triazine, pyrazine, pyridazine, pyrrole, furan, thiophene, pyrazole, imidazole, triazole, oxazole and thiazole. These rings may form a condensed ring with other aromatic rings. A substituent may be present on these rings. This substituent can be exemplified by the same substances as those of $R_1$ and $R_2$.

The compound represented by the following general formula (3) can be mentioned as a chelate magenta pigment.

[General Formula 3]

General formula (3)

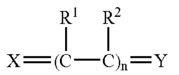

In the aforementioned general formula, X denotes a set of groups or atoms capable of forming at least a bidentate chelate. Y indicates a set of atoms for forming a 5- or 6-membered aromatic hydrocarbon ring or heterocyclic ring. $R^1$ and $R^2$ represent a hydrogen atom, and halogen atom or monovalent substituent, respectively. "n" indicates 0, 1 or 2.

The X denotes a set of groups or atoms capable of forming at least a bidentate chelate. Any substance can be used if it is capable of forming a pigment in accordance with the general formula (3). The preferred examples include 5-pyrazolone, imidazole, pyrazolopyrrole, pyrazolopyrazole, pyrazoloimidazole, pyrazolotriazole, pyrazolotetrazole, barbituric acid, thiobarbituric acid, rhodanine, hydantoin, thiohydantoin, oxazolone, isooxazolone, indandione, pyrazolidinedione, oxazolidinedione, hydroxypyridone and pyrazolopyridone.

The particularly preferred "X" is the group represented by the following general formula (4).

[Chemical Formula 4]

General formula (4)

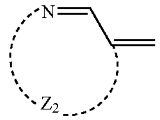

In the aforementioned general formula (4), $Z_2$ denotes a group of atoms required to form an aromatic nitrogen-containing heterocyclic ring replaced by a group containing nitrogen atoms capable of forming at least one chelate. Specific examples of the ring include rings of pyridine, pyrimidine, thiazole and imidazole. These rings form a condensed ring with other carbon ring (benzene ring) and heterocyclic ring (pyridine ring, etc.).

In the aforementioned general formula (3), Y indicates a set of atoms for forming a 5- or 6-membered aromatic hydrocarbon ring or heterocyclic ring. A substituent or a condensed ring may be arranged on this ring. Specific examples of the ring include 3H-pyrrole ring, oxazole ring, imidazole ring, thiazole ring, 3H-pyrrolidine ring, oxazolidine ring, imidazolidine ring, thiazolidine ring, 3H-indole ring, benzoxazole ring, benzimidazole ring, benzotiazole ring, quinoline ring and pyridine ring. These rings may form a condensed ring with other carbon ring (e.g. benzene ring) and heterocyclic ring (e.g. pyridine ring). The substituent on the ring is exemplified by alkyl group, aryl group, heterocycle group, acyl group, amino group, nitro group, cyano group, acylamino group, alkoxy group, hydroxy group, alkoxy carbonyl group and halogen atom. These groups can be further replaced.

$R^1$ and $R^2$ indicate the hydrogen atom and halogen atom (e.g. fluorine atom and chlorine atom) or monovalent substituent, respectively. The examples of monovalent substituent include alkyl group, alkoxy group, cyano group, alkoxy carbonyl group, aryl group, heterocycle group, carbamoyl group, hydroxy group, acyl group and acylamino group.

(Binder Resin)

In the present invention, the aforementioned pigment contains a binder resin.

The binder resin used in the thermal transfer ink sheet according to the thermally-sensitive sublimable transfer method known in the prior art can be used as a binder resin in the ink layer. The examples include water soluble polymers based on cellulose, polyacrylic acid, polyvinyl alcohol, polyvinyl pyrrolidone; and polymers, soluble in an organic solvent, such as acryl resin, methacryl resin, polystyrene, polycarbonate, polysulfone, polyether sulfone, polyvinyl butyral, polyvinyl acetal, and ethyl cellulose and nitro cellulose. Of these resins, polyvinyl butyral, polyvinyl acetal or cellulose resin characterized by excellent keeping quality are preferably used.

No restriction is imposed on the amounts of the pigment and binder resin in the ink layer. They can be set as required, from the viewpoint of ensuring good performances.

In addition to the pigment and binder resin described above, various additives known in the prior art can be added as required can be added to the ink layer according to the present invention. The ink layer is formed as follows: The ink coating solution prepared by dissolving and dispersing the aforementioned pigments, binder resins and other additives in an appropriate solvent is applied on the substrate sheet, according to the gravure printing and other methods known in the prior art, and is dried, whereby the ink layer is formed. The ink layer of the present invention has a thickness of 0.1 through 3.0 μm, or preferably 0.3 through 1.5 μm.

(Protective Layer)

In the present invention, the thermal transfer ink sheet is preferably provided with a thermal transfer type protective layer. The thermal transfer type protective layer is composed of a transparent plastic layer serving as a protective layer for covering the surface of the image formed by thermal transfer on the image receiving sheet.

The examples of the resin forming a protective layer include: polyester resin, polystyrene resin, acryl resin, polyurethane resin, acrylurethane resin, polycarbonate resin, resins made by epoxy-modification of these resins, resins formed by silicone-modification of these resins, mixture of these resins, ionizing radiation cured resin and ultraviolet ray shielding resins. The examples of the resin preferably used are polyester resins, polycarbonate resins, epoxy modified resins, and ionizing radiation cured resins. The aliphatic ring polyester resin including the aliphatic ring compound containing at least one type of diol components and acid components is preferably used as a polyester resin. The aromatic polycarbonate resin is particularly preferably as a polycarbonate resin. The aromatic polycarbonate resin described in the Official Gazette of Japanese Patent Tokkaihei 11-151867 is more preferably used.

The examples of the epoxy-modified resin used in the present invention are: epoxy modified urethane, epoxy modified polyethylene, epoxy modified polyethylene terephthalate, epoxy modified polyphenylsulfite, epoxy modified cellulose, epoxy modified polypropylene, epoxy modified polyvinyl chloride, epoxy modified polycarbonate, epoxy modified acryl, epoxy modified polystylene, epoxy modified polymethyl methacrylate, epoxy modified silicone, copolymer between epoxy modified polystyrene and epoxy modified polymethyl methacrylate, copolymer between epoxy modified acryl and epoxy modified polystyrene, and copolymer between epoxy modified acryl and epoxy modified silicone. Of these, the epoxy modified acryl, epoxy modified polystyrene, epoxy modified polymethyl methacrylate, epoxy modified silicone are preferably used. Further, the copolymer between epoxy modified polystyrene and epoxy modified polymethyl methacrylate, the copolymer between epoxy modified acryl and epoxy modified polystyrene and the copolymer between acryl and silicone are more preferably used.

<Ionizing Radiation Cured Resin>

An ionizing radiation cured resin can be used as the thermal transfer protective layer. When contained in the thermal transfer protective layer, the ionizing radiation cured resin improves the resistance to plasticizer and abrasion. The ionizing radiation known in the prior art can be employed in the present invention. For example, the radically polymerized polymer or oligomer is cross-linked and cured by ionizing radiation, and a photo-polymerization initiator is added as required. Then polymerization and curing are provided by electron beam and ultraviolet rays. This product obtained in this manner can be used.

<Ultraviolet Ray Shielding Resin>

The protective layer containing the ultraviolet ray shielding resin is intended to provide a print with light proofness. For example, it is possible to use the resin obtained by allowing a reactive ultraviolet absorber to react with the thermoplastic resin or the aforementioned ionizing radiation cured resin. To put it more specifically, such a resin includes the one obtained by introducing the reactive group such as an addition-polymerized double bond (e.g. vinyl group, acryloyl group and methacryloyl group), alcoholic hydroxyl group, amino group, carboxyl group, epoxy group, and isocyanate group, into the nonreactive organic ultraviolet absorber known in the prior art such as salicylate, benzophenone, benzotriazole, substitutional acrylonitryl, nickel chelate and hindered amine.

As described above, thermal transfer protective layer normally has a thickness of 0.5 through 10 μm although it may vary according to the type of the resin used to form the protective layer.

The thermal transfer protective layer of the present invention is preferably arranged on a substrate sheet through a non-transfer mold releasing layer.

To ensure that the adhesive strength between the substrate sheet and non-transfer mold releasing layer is sufficiently greater than that between the non-transfer mold releasing layer and thermal transfer protective layer, and the adhesive strength between non-transfer mold releasing layer and thermal transfer protective layer before the heat is applied is greater than that before the heat is applied; the non-transfer mold releasing layer is preferably contain:

(1) 30 through 80 percent by mass of an inorganic fine particle having an average grain size of 40 nm or less together with a resin binder;

(2) a total of 20 percent or more by mass of an alkylvinylether maleic anhydride copolymer and its derivative, or the mixture thereof; or (3) 20 percent or more by mass of ionomer resin.

Other additives may be contained in the non-transfer mold releasing layer, as required.

For example, silica fine particles such as silica anhydride and colloidal silica or a metallic oxide such as tin oxide, zinc oxide and zinc antimonate can be used as inorganic fine particles. The size of the inorganic fine particles is preferably 40 nm or less. This will reduce the projections and depressions on the surface of the thermal transfer protective layer, resulting from the projections and depressions on the surface of the mold releasing layer, with the result that the transparency of the protective layer is improved, as desired.

No particular restriction is imposed on the resin binder mixed with the inorganic fine particles. Any type of resin that can be mixed therewith can be used. For example, it is possible to use the polyvinyl alcohol resins (PVA) having various degrees of saponification such as polyvinyl acetal resin, polyvinyl butyral resin, acryl resin, polyamide resin; cellulose resin such as cellulose acetate, alkyl cellulose, carboxymethyl cellulose and hydroxyalkyl cellulose; and polyvinyl pyrrolidone.

The mix proportion between the inorganic fine particle and other mixtures mainly composed of resin binder (between the inorganic fine particle and other mixtures) is 30/70 or more without exceeding 80/20 in terms of mass ratio. When the mix proportion is 30/70 or more, effect of the inorganic fine particle can be sufficiently obtained. On the other hand, when the mix proportion does not exceed 80/20, a perfect mold releasing layer film can be easily obtained. This will avoid derivation of the portion in direct contact between the substrate sheet and protective layer.

As the alkylvinylether and maleic anhydride copolymer or the derivative thereof, it is possible to use, for example, the substance wherein the alkyl group of the alkylvinylether is composed of a methyl group or ethyl group, or the maleic anhydride is partly or wholly composed of a half ester with alcohol (e.g. methanol, ethanol, propanol, isopropanol, butanol, and isobutanol).

The mold releasing layer may be composed of alkylvinylether and maleic anhydride copolymer, its derivative and the mixture thereof. Other resins or fine particles can be added to adjust the separation force between the mold releasing layer and protective layer. In this case, the mold releasing layer preferably contains 20 percent or more by mass of alkylvinylether and maleic anhydride copolymer, its derivative and the mixture thereof. When 20 percent or more by mass is contained, the advantages of the alkylvinylether and maleic anhydride copolymer or its derivative and can be sufficiently provided.

No restriction is imposed on the resin or fine particle mixed with alkylvinylether and maleic anhydride copolymer or its derivative. Any substrate can be used if it can be mixed to provide a high film transparency at the time of forming a film. For example, the aforementioned inorganic fine particle and resin binder that can be mixed with the inorganic fine particle are used preferably.

Surlyn A (by Dupont) and Chemipearl S series (Mitsui Petrochemical Industries, Ltd.), for example, can be used as ionomer. The aforementioned inorganic fine particle, resin binder that can be mixed with the inorganic fine particle, or other resins and fine particle can be further added to the ionomer.

To form a non-transfer mold releasing layer. A coating solution containing any one of the aforementioned components (1) through (3) is prepared at a predetermined mix proportion. This solution is coated on the substrate sheet according to the method known in the prior art such as a gravure coating or gravure reverse coating method, and is dried. The non-transfer mold releasing layer normally has a thickness of about 0.1 through 2 μm after having been dried.

The thermal transfer protective layer laminated on the substrate sheet directly or through the non-transfer mold releasing layer may have a multi-layer structure or a single-layer structure. When the multi-layer structure is used, the following layers may be arranged in addition to the protective layer for mainly providing the image with resistance of various kinds. These layers are:

an adhesive layer arranged on the top surface of the thermal transfer protective layer to improve the bondability between the thermal transfer protective layer and the image receiving surface of the print;

an auxiliary protective layer; and a layer for providing functions other than the functions originally owned by the protective layer (e.g. anti-counterfeiting layer and hologram layer). The order of arrangement of the main protective layer and other layers can be determined as desired. Normally, other layers are arranged between the adhesive layer and main protective layer so that the main protective layer will be located on the top surface of the image receiving surface after transfer.

An adhesive layer may be arranged on the top surface of the thermal transfer protective layer. The adhesive layer can be formed by using the resin that provides excellent bondability at the time of heating. Examples of such a resin include an acryl resin, vinyl chloride resin, vinyl acetate resin, vinyl chloride/vinyl acetate copolymer resin, polyester resin and polyamide resin. In addition to the aforementioned resins, the aforementioned ionizing radiation cured resin, ultraviolet ray shielding resin and other resins may be mixed as required. The adhesive layer normally has a thickness of 0.1 through 5 μm.

To form a thermal transfer protective layer on the non-transfer mold releasing layer or the substrate sheet, a protective layer coating solution containing the protective layer forming resin, an adhesive layer coating solution containing a thermal adhesive resin, other coating solutions for forming a layer to be added as required are prepared in advance. They are coated on the non-transfer mold releasing layer or substrate sheet in a predetermined order, and are dried. They can be coated according to the method known in the prior art. An adequate primer layer may be arranged between layers.

<Ultraviolet Absorber>

A ultraviolet absorber is preferably contained in at least one layer of the thermal transfer protective layer. When it is contained in the transparent resin layer, the transparent layer is located on the top surface of the print after transfer of the protective layer. Accordingly, the advantages will be deteriorated under the ambient influence after the lapse of a long time. It is especially preferred that the ultraviolet absorber should be contained in the thermally-sensitive adhesive layer.

The examples of the ultraviolet absorber include the ultraviolet absorbers based on salicylic acid, benzophenone, benzotriazole and cyanoacrylate. To put it more specifically, they are sold on the market under the name of Tinuvin P, Tinuvin 234, Tinuvin 320, Tinuvin 326, Tinuvin 327, Tinuvin 328, Tinuvin 312 and Tinuvin 315 by Chiba Geigie Inc.; Sumisorb-110, Sumisorb-130, Sumisorb-140, Sumisorb-200, Sumisorb-250, Sumisorb-300, Sumisorb-320, Sumisorb-340, Sumisorb-350 and Sumisorb-400 by Sumitomo Chemical Co., Ltd.; and Mark LA-32, Mark LA-36 and Mark 1413 by Adekaahgas Kagaku Inc.

It is possible to use a random copolymer formed between the reactive ultraviolet absorber and acryl based monomer at Tg 60 degrees Celsius or more, or preferably 80 degrees Celsius or more.

The aforementioned reactive ultraviolet absorber to be used can be the one formed by introducing the addition polymerized double bond of vinyl group, acryloyl group and methacryloyl group, or alcohol based hydroxyl group, amino group, carboxyl group, epoxy group, isocyanate group or the like, into the nonreactive ultraviolet absorber, known in the prior art, based on salicylate, benzophenone, benzotriazole, substitutional acrylonitryl, nickel chelate and hindered amine. To put it more specifically, UVA635L and UVA633L by BASF Japan, and PUVA-30M by Otsuka are available on the market. Any of them is applicable to the present invention.

The amount of the reactive ultraviolet absorber in the random copolymer between the reactive ultraviolet absorber and the acryl monomer is 10 through 90 percent by mass, preferably 30 through 70 percent by mass. The molecular weight of the random copolymer can be about 5000 through 250000, preferably 9000 through 30000. The aforementioned ultraviolet absorber and the random copolymer between the reactive ultraviolet absorber and the acryl monomer can be separately contained. The amount of the random copolymer between the reactive ultraviolet absorber and the acryl monomer to be added is preferably within the range from 5 through 50 percent by mass with respect to the layer that contain the same.

It goes without saying that, in addition to the ultraviolet absorber, a light proofing agent can also be added. The light proofing agent is a chemical for preventing the pigment from being degenerated and decomposed, by absorbing or shielding the action of degenerating or degrading the pigment by light energy, heat energy or oxidation. To put it more specifically, a light stabilizer known in the prior art as a synthetic resin can be mentioned, in addition to the aforementioned ultraviolet-ray-blocking agent. In this case, the light stabilizer may be contained in at least one of the thermal transfer protective layers, namely, at least one of the aforementioned stripping layer, transparent resin layer and thermally-sensitive adhesive agent. It is particularly preferred that the light stabilizer should be contained in the thermally-sensitive adhesive agent.

The amount of light proofing agent to be used, including the aforementioned ultraviolet absorber, is not particularly restricted. The preferred amount is 0.05 through 10 parts by mass for 100 parts by mass of the resin forming the layer for containing the same. The still preferred amount is 3 through 10 parts by mass. If the amount to be used is too small, the advantages of the light proofing agent cannot be effectively utilized. If the amount to be used is too great on the other hand, unwanted costs will be consumed.

In addition to the aforementioned light proofing agent, an additive such as fluorescent whitening agent and active filler can be added simultaneously in an adequate amount to the adhesive layer.

The transparent resin layer of the protective layer transfer sheet may be arranged independently on the substrate sheet, or may be arranged in a field-sequential order with the ink sheet of the thermal transfer ink sheet.

(Heat Resistant Slipping Layer)

It is preferred in the thermal transfer ink sheet of the present invention that the heat resistant slipping layer should be arranged on the surface of the opposite side of the ink layer, sandwiching the substrate sheet.

The heat resistant slipping layer is provided to avoid thermal fusion between the heating device such as a thermal head and the substrate sheet to ensures smooth traveling, and to remove a deposit on the thermal head.

The resin used for this heat resistant slipping layer is exemplified by:

a cellulose resin such as ethyl cellulose, hydroxy cellulose, hydroxypropyl cellulose, methyl cellulose, cellulose acetate, cellulose acetate butyrate and nitro cellulose;

a vinyl resin such as polyvinyl alcohol, polyvinyl acetate, polyvinyl butyral, polyvinyl acetal and polyvinyl pyrrolidone;

an acryl resin such as methyl polymethacrylate, ethyl polyacrylate, polyacryl amide and acrylonitryl-styrene copolymer; and a single substance or a mixture of naturally occurring resin or synthetic resin, such as polyimide resin, polyamide resin, polyamidoimide resin, polyvinyl toluene resin, coumarone indene resin, polyester resin, polyurethane resin and silicone-modified or fluorine-modified urethane. Of the aforementioned resins, the resins having a reactive group based on hydroxyl group are used to further improve the heat resistance of the heat resistant slipping layer. As a cross-linking agent, polyisocyanate is used in combination so that a cross-linked resin layer will be formed.

To improve slip characteristics with the thermal head, solid or liquid mold releasing agent or lubricant can be applied to heat resistant slipping layer, whereby heat resistant slippage is enhanced. The mold releasing agent and lubricant to be used includes: polyethylene wax, paraffin wax, other waxes, higher aliphatic alcohol, organo polysiloxane, anion surface active agent, cation surface active agent, ampholytic surface active agent, nonionic surface active agent, fluorine surface active agent, metal soap, organic carboxylic acid and its derivatives, fluorine resin, silicone resin, talc, silica and other inorganic compound. The fine particles of these substances can be used as the mold releasing agent and lubricant. The amount of lubricant contained in the heat resistant slipping layer is 5 through 50 percent by mass, preferably about 10 through 30 percent by mass. The thickness of the heat resistant slipping layer can be about 0.1 through 10 μm, preferably about 0.3 through 5 μm.

EXAMPLES

The following describes the specific examples of the present invention with reference to embodiments, without the present invention being restricted thereto:

<<Manufacturing the Thermal Transfer Image Receiving Sheet>>

[Manufacturing the Thermal Transfer Image Receiving Sheet 1]

The heat insulating layer coating solution 1 was coated on the bond paper having a basis weight of 101 $g/m^2$ so that the solution would be 3.5 $g/m^2$ in terms of dry weight as a solid. In this case, the heat insulating layer coating solution 1 comprised 70 parts of hollow particles of thermally expansive plastic substances with shell walls (Matsumoto Microsphere F-30 by Matsumoto Yushi Co., Ltd.) having a softening point of 80 through 85 degrees Celsius; and 30 parts of polyvinyl alcohol. It was dried at 120 degrees celsius for 1 minute to form the heat insulating layer. The thermally expansive plastic substances expanded 30 through 70 times when dried by heat. The intermediate layer coating solution 1 composed of polyvinyl alcohol was coated on this heat insulating layer to form an intermediate layer, wherein this solution was 3.5 $g/m^2$ in terms of dry weight as a solid. Then the image receiving layer coating solution 1 composed of the following compositions was coated further thereon, so that this solution would be 4 $g/m^2$ in terms of dry weight as a solid. It was dried at 120 degrees Celsius for 5 minutes to form thermal transfer image receiving sheet 1.

| (Preparing the image receiving layer coating solution 1: solvent based coating solution) | |
|---|---|
| Polyester resin (Vylon 200 by Toyobo Co., Ltd.) | 1.0 parts by mass |
| Amino modified silicone (KF-393 by Shinetsu Chemical Co. Ltd.) | 0.03 parts by mass |
| Epoxy modified silicone (X-22-343 by Shinetsu Chemical Co. Ltd.) | 0.03 parts by mass |
| Methyl ethyl ketone/toluene/cyclohexane (mass ratio: 4:4:2) | 9.0 parts by mass |

[Manufacturing the Thermal Transfer Image Receiving Sheet 2]

The coated paper 1 with the permeability adjusted by calender processing (permeability: 1,700 sec.; basis weight: 170 $g/m^2$) was used as a substrate. The heat insulating layer coating solution 2 of the following composition was coated on the coated surface of the substrate and dried so that the thickness of the dried film was 30 μm, whereby the heat insulating layer was formed. Then the intermediate layer coating solution 2 of the following composition was coated and on the heat insulating layer and dried so that the thickness of the dried film was 5 μm, whereby intermediate layer was formed. Further, the image receiving layer coating solution 2 of the following composition was coated on the intermediate layer, whereby the image receiving layer was formed. Thus, the thermal transfer image receiving sheet 2 was manufactured.

| (Preparing the heat insulating layer coating solution 2) | |
|---|---|
| Hollow particle (hollow particle of styrene acryl based resin, hollow volume ratio: 55%; average grain size; 1 μm; Lopake by Rome and Haas Co. HP-1055) | 100 parts by mass |
| 15% solution of polyvinyl alcohol resin (KM-11 Nippon Gosei Kagaku Co., Ltd.) | 19 parts by mass |
| Water | 40 parts by mass |

| (Preparing the intermediate layer coating solution 2) | |
|---|---|
| Urethane resin (Hydran AP-40 by Dai Nippon Ink and Chemicals., Inc.) | 50 parts by mass |
| 10% solution of polyvinyl alcohol resin (KM-11 Nippon Gosei Kagaku Co., Ltd.) | 50 parts by masss |
| **(Preparing the image receiving layer coating solution 2: solvent based coating solution)** | |
| Vinyl chloride-vinyl acetate copolymer resin (#1000AKT by Denki Kagaku Kogyo Co., Ltd.) | 100 parts by mass |
| Amino modified silicone (KS-343 by Shinetsu Chemical Co, Ltd.) | 5 parts by mass |
| Epoxy modified silicone (KF-393 by Shinetsu Chemical Co, Ltd.) | 5 parts by mass |
| Methyl ethyl ketone | 200 parts by mass |
| Toluene | 200 parts by mass |

[Manufacturing the Thermal Transfer Image Receiving Sheet 3]

The thermal transfer image receiving sheet 3 was manufactured in the same procedure as that in manufacturing the aforementioned thermal transfer image receiving sheet 2, except that the coated paper 2 with the permeability adjusted by calender processing (permeability: 3,100 sec.; basis weight: 170 $g/m^2$), instead of the coated paper 1, was used as a substrate.

[Manufacturing the Thermal Transfer Image Receiving Sheet 4]

The heat insulating layer coating solution 3 composed of the following composition was coated, according to the wire bar coating method, on one surface of the polyethylene coated paper wherein with both sides of the basis paper having a thickness of 170 $g/m^2$ were coated with polyethylene (8% of anatase type titanium oxide was contained in the polyethylene on the side of the porous layer; 0.05 $g/m^2$ of the gelatine-undercoated layer was provided on the side of the porous layer surface; and 0.2 $g/m^2$ of the back layer containing the latex polymer having Tg of about 80 degrees Celsius was arranged on the side opposite to the porous layer surface), in such a way that the dry weight as a solid would be 25 $g/m^2$. Then the image receiving layer coating solution 3 composed of the following composition was coated according to the wire bar coating method on the wet-on-wet basis, in such a way that the dry weight as a solid will be 4.0 $g/m^2$. Then it was dried at 120 degrees Celsius for 60 sec., whereby the thermal transfer image receiving sheet 4 was manufactured.

| (Preparing the heat insulating layer coating solution 3) | |
|---|---|
| Acrylstyrene based hollow particles (Nipol MH 5055 by Nippon Zeon Co., Ltd.) | 100 parts by mass |
| 8 percent aqueous solution of polyvinyl alcohol (by Kuraray Kogyo Co., Ltd.; average degree of polymerization: 3,500) | 47 parts by mass |
| Gelatine | 3.7 parts by mass |
| Water | 40 parts by mass |

The ratio in terms of parts by mass of hollow particle/binder (polyvinyl alcohol+acid-treated gelatine) in the aforementioned heat insulating layer coating solution 3 is 80/20.

| (Preparing the image receiving layer coating solution 3: water-based coating solution) | |
|---|---|
| Water dispersed polyester (MD-1200 by Toyobo Co., Ltd.; percentage of solid: 34% by mass) | 50 parts by mass |
| Gelatine | 8 parts by mass |
| Fluorine based surface active agent (FC-4430 by Sumitomo 3M Limited) | 1.2 parts by mass |
| Pure water | 31.2 parts by mass |

[Manufacturing the Thermal Transfer Image Receiving Sheet 5]

The thermal transfer image receiving sheet 5 was manufactured in the same procedure as that in manufacturing the aforementioned thermal transfer image receiving sheet 4, except that the heat insulating layer coating solution 3 and image receiving layer coating solution 3 were simultaneously coated using a coater according to the slide hopper method.

[Manufacturing the Thermal Transfer Image Receiving Sheet 6]

The thermal transfer image receiving sheet 6 was manufactured in the same procedure as that in manufacturing the aforementioned thermal transfer image receiving sheet 4, except that an intermediate layer was arranged between the heat insulating layer and image receiving layer, using the intermediate layer coating solution 1 of the following composition, in such a way that the solution would be 1.0 $g/m^2$ in terms of dry weight as a solid. In this case, the heat insulating layer coating solution 3 and intermediate layer coating solution 1 were coated simultaneously using a slide hopper.

| (Preparing the intermediate layer coating solution 3) | |
|---|---|
| 8 percent aqueous solution of polyvinyl alcohol (by Kuraray Kogyo Co., Ltd.; average degree of polymerization: 3,500) | 15 parts by mass |
| Gelatine | 15 parts by mass |
| 6 percent aqueous solution of nitric acid | 6 parts by mass |
| Anatase type titanium oxide | 10 parts by mass |
| Water | 54 parts by mass |

[Manufacturing the Thermal Transfer Image Receiving Sheet 7]

The thermal transfer image receiving sheet 7 was manufactured in the same procedure as that in manufacturing the aforementioned thermal transfer image receiving sheet 6, except that the image receiving layer coating solution 3 was changed into the image receiving layer coating solution 4 of the following composition.

| (Preparing the image receiving layer coating solution 4: solvent based coating solution) | |
|---|---|
| Polyethylene terephthalate | 10 parts by mass |
| Dimethyl silicone | 1 part by mass |
| Methyl ethyl ketone/toluene = 1/1 | 40 parts by mass |

[Manufacturing the Thermal Transfer Image Receiving Sheet 8]

The thermal transfer image receiving sheet 8 was manufactured in the same procedure as that in manufacturing the aforementioned thermal transfer image receiving sheet 6, except that the heat insulating layer coating solution 3, intermediate layer coating solution 1 and image receiving layer coating solution 3 were simultaneously coated using a coater according to the slide hopper method.

[Manufacturing the Thermal Transfer Image Receiving Sheet 9]

The thermal transfer image receiving sheet 9 was manufactured in the same procedure as that in manufacturing the aforementioned thermal transfer image receiving sheet 8, except that the heat insulating layer coating solution 3 was changed into the heat insulating layer coating solution 4 of the following composition.

| (Preparing the heat insulating layer coating solution 4) | |
|---|---|
| Acrylstyrene based hollow particles (Nipol MH 5055 by Nippon Zeon Co., Ltd.) | 100 parts by mass |
| 8 percent aqueous solution of polyvinyl alcohol (by Kuraray Kogyo Co., Ltd.; average degree of polymerization: 3,500) | 5.0 parts by mass |
| Gelatine | 2.2 parts by mass |
| Water | 3.0 parts by mass |

The ratio in terms of parts by mass of hollow particle/binder (polyvinyl alcohol+acid-treated gelatine) in the aforementioned heat insulating layer coating solution 4 is 92/8.

[Manufacturing the Thermal Transfer Image Receiving Sheet 10]

The thermal transfer image receiving sheet 10 was manufactured in the same procedure as that in manufacturing the aforementioned thermal transfer image receiving sheet 8, except that the heat insulating layer coating solution 3 was changed into the heat insulating layer coating solution 5 of the following composition.

| (Preparing the heat insulating layer coating solution 5) | |
|---|---|
| Acrylstyrene based hollow particles (Nipol MH 5055 by Nippon Zeon Co., Ltd.) | 100 parts by mass |
| 8 percent aqueous solution of polyvinyl alcohol (by Kuraray Kogyo Co., Ltd.; average degree of polymerization: 3,500) | 146 parts by mass |
| Gelatine | 10 parts by mass |
| Water | 244 parts by mass |

The ratio in terms of parts by mass of hollow particle/binder (polyvinyl alcohol+acid-treated gelatine) in the aforementioned heat insulating layer coating solution 5 is 58/42.

[Manufacturing the Thermal Transfer Image Receiving Sheet 11]

The thermal transfer image receiving sheet 11 was manufactured in the same procedure as that in manufacturing the aforementioned thermal transfer image receiving sheet 7, except that the image receiving layer coating solution 4 was changed into the image receiving layer coating solution 5 of the following composition.

(Preparing the Image Receiving Layer Coating Solution 5: Solvent Based Coating Solution)

| (Preparing the heat insulating layer coating solution 5: solvent based coating solution | |
|---|---|
| Polyethylene terephthalate | 10 parts by mass |
| Dimethyl silicone | 1 part by mass |
| Metal source: MS-1 | 4 parts by mass |
| Methyl ethyl ketone/toluene = 1/1 | 40 parts by mass |

[Chemical Formula 5]

MS-1

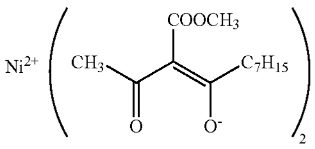

[Manufacturing the Thermal Transfer Image Receiving Sheet 12]

The thermal transfer image receiving sheet 12 was manufactured in the same procedure as that in manufacturing the aforementioned thermal transfer image receiving sheet 8, except that the image receiving layer coating solution 3 was changed into the image receiving layer coating solution 6 of the following composition.

| (Preparing the image receving layer coating solution 6: water based coating solution) | |
|---|---|
| Water dispersed polyester (MD-1200 by Toyobo Co., Ltd.; percentage of solid: 34% by mass) | 50 parts by mass |
| Alkali treated gelatine | 8 parts by mass |
| Fluorine based surface active agent (FC-4430 by Sumitomo 3M Limited) | 1.2 parts by mass |
| Metal source: $NiCl_2$ | 10 parts by mass |
| Pure water | 31.2 parts by mass |

<<Image Formation>>

The image receiving layer of each of the thermal transfer image receiving sheets having been manufactured and the ink layer of the thermal transfer ink sheet for Pe602 by Konica Minolta Photo-Imaging Co., Ltd. were placed on a thermal transfer recording apparatus equipped with a thermal head having a square resistor (80 μm in the main scanning direction by 120 μm in the sub-scanning direction) and a line head of 300 dpi ("dpi" refers to the number of dots per 2.54 cm), and were set in position. While they were pressed by the thermal head and platen roll, the energy applied thereto was increased gradually. Each step pattern patch of the yellow, magenta, cyan and neutral (overlapping of three colors; yellow, magenta and cyan) was heated from the rear of the ink layer at a feed rate of 2.5 msec/line and at a feed length of 85 μm per line. Each pigment was transferred onto the image receiving layer of the thermal transfer image receiving sheet, whereby an image was formed.

<<Evaluation of a Formed Image>>

The image printed according to the aforementioned procedure was evaluated according to the following procedure.

(Evaluation of Sensitivity)

An image was formed according to the aforementioned method for image formation by changing applied energy, using each thermal transfer image receiving sheet. The applied energy E (m/J/mm$^2$) required to get a reflection density of 1.0 was measured, and sensitivity was evaluated according to the following criteria:

A: E≦4.8 mJ/mm$^2$

B: 4.8 mJ/mm$^2$<E≦5.2 mJ/mm$^2$

C: 5.2 mJ/mm$^2$<E≦5.6 mJ/mm$^2$

D: E>5.6 mJ/mm$^2$ (Evaluation of Resistance to a White Patch on a Print)

A visual inspection was made to check for a white patch on an image of each step pattern patch printed according to the aforementioned procedure (a white spot trouble on the solid image). Resistance to a white patch on a print was evaluated according to the following criteria.

A: No white patch on a printed image

B: Almost no white patch on a printed image

C: Very small white patches sporadically present on a printed image within tolerance limit for practical use D: Conspicuous white patches on a printed image. Poor quality giving an adverse effect on practical use Table 1 shows the results of the evaluation tests conducted according to the aforementioned criteria.

TABLE 1

| Thermal transfer image receiving sheet | Substrate | Heat insulating layer: Coating solution number | Heat insulating layer: Type of hollow particles | Heat insulating layer: Content (% by mass) | Intermediate layer coating solution number | Image receiving layer: Coating solution number | Image receiving layer: Type of coating solution | Image receiving layer: With/without MS | Image receiving layer: Method for coating | Evaluation results: Sensitivity | Evaluation results: Resistance to white patch | Remarks |
|---|---|---|---|---|---|---|---|---|---|---|---|---|
| 1 | Bond paper | 1 | Thermal expansion type | 70 | — | 1 | Solvent | Without | Sequential coating | D | D | Comp. |
| 2 | Coated paper1 | 2 | Evaporation type | 63 | — | 2 | Solvent | Without | Sequential coating | C | C | Comp. |

TABLE 1-continued

| Thermal transfer image receiving sheet | Substrate | Heat insulating layer: Coating solution number | Heat insulating layer: Type of hollow particles | Heat insulating layer: Content (% by mass) | Intermediate layer coating solution number | Image receiving layer: Coating solution number | Image receiving layer: Type of coating solution | Image receiving layer: With/without MS | Method for coating | Evaluation results: Sensitivity | Evaluation results: Resistance to white patch | Remarks |
|---|---|---|---|---|---|---|---|---|---|---|---|---|
| 3 | Coated Paper2 | 2 | Evaporation type | 63 | — | 2 | Solvent | Without | Sequential coating | C | D | Comp. |
| 4 | RC paper | 3 | Evaporation type | 80 | — | 3 | Water-based | Without | Wet-on-wet basis | B | D | Comp. |
| 5 | RC paper | 3 | Evaporation type | 80 | — | 3 | Water-based | Without | Simultaneous two-layer coating | B | B | Inv. |
| 6 | RC paper | 3 | Evaporation type | 80 | — | 3 | Water-based | Without | Simultaneous two-layer coating | B | A | Inv. |
| 7 | RC paper | 3 | Evaporation type | 80 | 1 | 4 | Solvent | Without | Simultaneous two-layer coating | A | A | Inv. |
| 8 | RC paper | 3 | Evaporation type | 80 | 1 | 3 | Water-based | Without | Simultaneous three-layer coating | B | A | Inv. |
| 9 | RC paper | 4 | Evaporation type | 92 | 1 | 3 | Water-based | Without | Simultaneous three-layer coating | B | B | Inv. |
| 10 | RC paper | 5 | Evaporation type | 58 | 1 | 3 | Water-based | Without | Simultaneous three-layer coating | C | A | Comp. |
| 11 | RC paper | 3 | Evaporation type | 80 | 1 | 5 | Solvent | With | Simultaneous two-layer coating | A | A | Inv. |
| 12 | RC paper | 3 | Evaporation type | 80 | 1 | 6 | Water-based | With | Simultaneous three-layer coating | A | A | Inv. |

Inv.: This invention
Comp.: Comparative example

As is apparent from the results given in Table 1, the thermal transfer image receiving sheet configured according to the present invention has a higher sensitivity than those in the comparative examples, and has a greater resistance to white spots occurring on the image. Table 1 further shows that the aforementioned advantage is greater when the content of the hollow particles in the heat insulating layer is 65 through 90 percent by mass; an intermediate layer is provided between the heat insulating layer and image receiving layer; or a metal source is added into the image receiving layer.

[Embodiment 2]

[Manufacturing the Thermal Transfer Image Receiving Sheet 13]

The heat insulating layer coating solution 6 of the following composition was coated on one surface of the same polyethylene coated paper as the substrate sheet used in the aforementioned thermal transfer image receiving sheet 4 according to the wire bar coating method so that the solution would be 20 g/$m^2$ in terms of dry weight as a solid. Then it was dried at 90 degrees Celsius for 60 sec. Then the image receiving layer coating solution 7 of the following composition was coated according to the wire bar coating method so that the solution would be 2.5 g/$m^2$ in terms of dry weight as a solid. Then it was dried at 90 degrees Celsius for 60 sec., whereby the thermal transfer image receiving sheet 13 was manufactured.

| (Preparing the heat insulating layer coating solution 6) | |
|---|---|
| Acrylstyrene based hollow particles (Lopake HP-1055 by Rome and Haas Co.; 27% solid) | 37.0 parts by mass |
| Cross-linked acrylstyrene based hollow particles (SX866B by JSR Co., Ltd., 20% solid)) | 15.0 parts by mass |
| Acryl based resin emulsions (AE986A by JSR Co., Ltd., 35% solid) | 15.1 parts by mass |
| Gelatine | 1.7 parts by mass |
| Water | 31.2 parts by mass |

The ratio in terms of parts by mass of hollow particle/binder (acryl+gelatine) in the aforementioned heat insulating layer coating solution 6 is 65/35.

| (Preparing the image receiving layer coating solution 7) | |
|---|---|
| Polyvinyl chloride resin emulsion (SUMIELITE 1210 by Sumitomo Chemical Industries Co., Ltd.; 50% solid) | 9.6 parts by mass |
| Betaine surface active agent (4% solid) | 0.3 parts by mass |
| Gelatine | 1.7 parts by mass |
| Water | 88.4 parts by mass |

[Manufacturing the Thermal Transfer Image Receiving Sheet 14]

The thermal transfer image receiving sheet 14 was manufactured in the same procedure as that in manufacturing the aforementioned thermal transfer image receiving sheet 13, except that the heat insulating layer coating solution 6 and image receiving layer coating solution 7 were coated simultaneously using the coater according to the slide hopper method.

[Manufacturing the Thermal Transfer Image Receiving Sheet 15]

The thermal transfer image receiving sheet 15 was manufactured in the same procedure as that in manufacturing the aforementioned thermal transfer image receiving sheet 13, except that the heat insulating layer coating solution 6 was changed into the heat insulating layer coating solution 7 of the following composition.

| (Preparing the heat insulating layer coating solution 7) | |
|---|---|
| Acrylstyrene based hollow particles (Lopake HP-1055 by Rome and Haas Co.; 27% solid) | 34.2 parts by mass |
| Cross-linked acrylstyrene based hollow particles (SX866B by JSR Co., Ltd., 20% solid)) | 13.9 parts by mass |
| Acryl based resin emulsions (AE986A by JSR Co., Ltd., 35% solid)) | 15.1 parts by mass |
| Gelatine | 1.7 parts by mass |
| Water | 35.1 parts by mass |

The ratio in terms of parts by mass of hollow particle/binder (acryl+gelatine) in the aforementioned heat insulating layer coating solution 7 is 60/40.

[Manufacturing the Thermal Transfer Image Receiving Sheet 16]

The thermal transfer image receiving sheet 16 was manufactured in the same procedure as that in manufacturing the aforementioned thermal transfer image receiving sheet 14, except that the heat insulating layer coating solution 6 was changed into the heat insulating layer coating solution 7 of the following composition.

For thermal transfer image receiving sheets 2, 13, 14, 15 and 16, the sensitivity and resistance to a white patch on a printed image were evaluated according to the same criteria as those in the first embodiment. For the sensitivity, however, the applied energy required to provide a reflection density of 1.0 in the thermal transfer image receiving sheet 2 was assumed as 100, and the energy of other image receiving layers was expressed in terms of relative values with respect to this value. Thus, the sensitivity is higher as the value is smaller.

TABLE 2

| Thermal transfer image receiving sheet number | Content of hollow particles in heat insulating layer (% by mass) | Heat insulating layer/image receiving layer coating method | Evaluation result: Sensitivity | Evaluation result: Resistance to white patch | Remarks |
|---|---|---|---|---|---|
| 2 | | | 100 | C | Comparative example |
| 13 | 65 | Sequential coating | 90 | D | Comparative example |
| 14 | 65 | Simultaneous two-layer coating | 80 | A | Present invention |
| 15 | 60 | Sequential coating | 103 | D | Comparative example |
| 16 | 60 | Simultaneous two-layer coating | 101 | D | Comparative example |

As is apparent from Table 2, the thermal transfer image receiving sheet configured according to the present invention ensures both excellent sensitivity and resistance to white patch to be compatible with each other, as compared to the comparative examples.

What is claimed is:

1. A thermal transfer image receiving sheet comprising a heat insulating layer and a layer adjacent to the heat insulating layer on a substrate, wherein the heat insulating layer is provided between the layer and the substrate, the heat insulating layer contains hollow particles in an amount of at least 65 percent by mass, and the heat insulating layer and the layer are formed by simultaneous multi-layer coating.

2. The thermal transfer image receiving sheet described in claim 1, wherein the layer is an image receiving layer.

3. The thermal transfer image receiving sheet described in claim 1, wherein the layer is an intermediate layer, and an image receiving layer is provided on the intermediate layer.

4. The thermal transfer image receiving sheet described in claim 2, wherein the image receiving layer contains a metal ion-containing compound capable of forming a chelate compound through reaction with a dye capable of forming a chelate.

5. The thermal transfer image receiving sheet described in claim 3, wherein the image receiving layer contains a metal ion-containing compound capable of forming a chelate compound through reaction with a dye capable of forming a chelate.

6. The thermal transfer image receiving sheet described in claim 1, wherein at least 3 percent by mass of the particles are cross-linked hollow particles.

7. A method for manufacturing a thermal transfer image receiving sheet as defined in claim 1 comprising forming the heat insulating layer and the layer adjacent to the heat insulating layer by simultaneous multi-layer coating.

8. The method of claim 7, wherein the layer is an image receiving layer.

9. The method of claim 7, wherein the layer is an intermediate layer, and an image receiving layer is provided on the intermediate layer.

10. The method of claim 8, wherein said image receiving layer contains a metal ion-containing compound capable of forming a chelate compound through reaction with a dye capable of forming a chelate.

11. The method of claim 9, wherein said image receiving layer contains a metal ion-containing compound capable of forming a chelate compound through reaction with a dye capable of forming a chelate.

12. The method of claim 7, wherein at least 3 percent by mass of the particles are cross-linked hollow particles.

* * * * *